(12) United States Patent
Choi et al.

(10) Patent No.: US 11,199,937 B2
(45) Date of Patent: Dec. 14, 2021

(54) TOUCH SENSOR HAVING IMPROVED SENSING SENSITIVITY AND DISPLAY DEVICE INCLUDING THE SAME

(71) Applicant: Samsung Display Co., Ltd., Yongin-Si (KR)

(72) Inventors: Won Jun Choi, Yongin-si (KR); Il Joo Kim, Yongin-si (KR); Deok Jung Kim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/805,981

(22) Filed: Mar. 2, 2020

(65) Prior Publication Data

US 2020/0371644 A1 Nov. 26, 2020

(30) Foreign Application Priority Data

May 23, 2019 (KR) .................. 10-2019-0060745

(51) Int. Cl.
  *G06F 3/045* (2006.01)
  *G06F 3/044* (2006.01)
(52) U.S. Cl.
  CPC .......... *G06F 3/0448* (2019.05); *G06F 3/0443* (2019.05)
(58) Field of Classification Search
  CPC ....................... G06F 3/0448; G06F 3/0443

USPC ......................................................... 345/174
See application file for complete search history.

(56) References Cited

U.S. PATENT DOCUMENTS

| | | | |
|---|---|---|---|
| 10,324,575 B2 | 6/2019 | Hwang et al. | |
| 2017/0185224 A1* | 6/2017 | Nagata | G02F 1/13338 |
| 2018/0157354 A1* | 6/2018 | Blondin | G06F 3/0443 |
| 2018/0240850 A1* | 8/2018 | Chen | G06F 3/0446 |
| 2018/0267656 A1 | 9/2018 | Moon et al. | |
| 2019/0302942 A1 | 10/2019 | Kim et al. | |

FOREIGN PATENT DOCUMENTS

| | | |
|---|---|---|
| KR | 10-2018-0105767 A | 10/2018 |
| KR | 10-2018-0131799 A | 12/2018 |
| KR | 10-2019-0114063 A | 10/2019 |

* cited by examiner

*Primary Examiner* — Jonathan M Blancha
(74) *Attorney, Agent, or Firm* — Innovation Counsel LLP

(57) ABSTRACT

A touch sensor includes a base layer including a sensing area and a non-sensing area; and a sensor electrode disposed in the sensing area and including sensor patterns. The sensing area may include a first area including at least one non-square boundary with a predetermined curvature and a second area not including the non-square boundary. In an exemplary embodiment of the present inventive concept, sensor patterns disposed in the first area and sensor patterns disposed in the second area among the sensor patterns may have different sizes from each other.

25 Claims, 24 Drawing Sheets

TOUCH SENSOR HAVING IMPROVED SENSING SENSITIVITY AND DISPLAY DEVICE INCLUDING THE SAME

CROSS-REFERENCE TO RELATED APPLICATION

This application claims priority to and the benefit of Korean Patent Application No. 10-2019-0060745 filed in the Korean Intellectual Property Office on May 23, 2019, the entire contents of which are incorporated herein by reference.

BACKGROUND

1. Field

The present inventive concept relates to a touch sensor and a display device including the same.

2. Description of the Related Art

A touch sensor is a kind of information input device, and may be included in a display device. For example, the touch sensor may be attached to one side of a display panel or may be manufactured integrally with the display panel. The user may input information by pressing or touching the touch sensor while viewing an image displayed on a screen of the display device.

Recently, as the display technology has been developed, the display device may have various shapes other than a quadrangle shape. However, a sensing sensitivity in the non-square boundary area may be lower than a sensing sensitivity in another area when having the same shape of a sensor electrode and a sensor pattern.

SUMMARY

An exemplary embodiment of the present inventive concept provides a touch sensor capable of improving a sensing sensitivity in one area by differentiating a size of a sensor electrode disposed in one area including a non-square boundary and a size of a sensor electrode disposed in another area not including the non-square boundary.

In addition, an exemplary embodiment of the present inventive concept provides a display device including the touch sensor.

A touch sensor according to an exemplary embodiment of the present inventive concept includes a base layer including a sensing area and a non-sensing area; and a sensor electrode disposed in the sensing area and including sensor patterns.

In an exemplary embodiment of the present inventive concept, the sensing area includes a first area including at least one non-square boundary with a predetermined curvature and a second area not including the non-square boundary. Sensor patterns disposed in the first area and sensor patterns disposed in the second area among the sensor patterns may have different sizes from each other.

In an exemplary embodiment of the present inventive concept, the sensor patterns disposed in the first area may have a less size than the sensor patterns disposed in the second area.

In an exemplary embodiment of the present inventive concept, the sensor patterns may include at least one middle sensor pattern disposed to overlap a boundary line between the first area and the second area.

In an exemplary embodiment of the present inventive concept, the middle sensor pattern may have a different size from each of the sensor patterns disposed in the second area.

In an exemplary embodiment of the present inventive concept, the middle sensor pattern may include a first sub-sensor pattern disposed in the first area and a second sub-sensor pattern disposed in the second area.

In an exemplary embodiment of the present inventive concept, the first sub-sensor pattern and the second sub-sensor pattern may have a symmetrical structure with respect to a boundary line between the first area and the second area.

In an exemplary embodiment of the present inventive concept, the middle sensor pattern may have a less size than the sensor patterns disposed in the second area.

In an exemplary embodiment of the present inventive concept, the first sub-sensor pattern and the second sub-sensor pattern may have a different size each other.

In an exemplary embodiment of the present inventive concept, the first sub-sensor pattern may be a less size than the second sub-sensor pattern.

In an exemplary embodiment of the present inventive concept, the first sub-sensor pattern and the second sub-sensor pattern may have an asymmetric structure with respect to a virtual line extending in one direction.

In an exemplary embodiment of the present inventive concept, the sensor patterns may include first sensor patterns and first bridge patterns connecting the first sensor patterns; second sensor patterns and second bridge patterns connecting the second sensor patterns; and dummy electrodes disposed between the first and second sensor patterns.

In an exemplary embodiment of the present inventive concept, dummy electrodes disposed to overlap a boundary between the first area and the second area among the dummy electrodes may be connected each other to maintain a continuity.

In an exemplary embodiment of the present inventive concept, dummy electrodes disposed in the first area and dummy electrodes disposed in the second area among the dummy electrodes may have a same shape.

In an exemplary embodiment of the present inventive concept, dummy electrodes disposed in the first area and dummy electrodes disposed in the second area among the dummy electrodes may have a different shape.

In an exemplary embodiment of the present inventive concept, the dummy electrodes disposed in the first area may have a greater width than or a less width than the dummy electrodes disposed in the second area.

In an exemplary embodiment of the present inventive concept, first and second bridge patterns disposed in the first area may not be disposed on a line connecting the first and second bridge patterns disposed in the second area in a same column.

In an exemplary embodiment of the present inventive concept, the first and second bridge patterns disposed in the first area may be disposed close to the boundary disposed between the first area and the second area than the first and second bridge patterns disposed in the second area.

A display device according to an exemplary embodiment of the present inventive concept includes a display panel for displaying an image; and a touch sensor disposed on the display panel. Here, the touch sensor may include a base layer including a sensing area and a non-sensing area; and a sensing electrode disposed in the sensing area and including sensor patterns. Here, the sensing area includes a first area including at least one non-square boundary with a predetermined curvature and a second area not including the non-square boundary.

In an exemplary embodiment of the present inventive concept, sensor patterns disposed in the first area and sensor patterns disposed in the second area among the sensor patterns may have different sizes from each other.

In an exemplary embodiment of the present inventive concept, the display panel may include a substrate including a display area displaying the image and a non-display area provided at least one side of the display area; a pixel circuit layer disposed on the substrate and including at least one transistor; a display element layer disposed on the pixel circuit layer and including at least one light emitting element that emits light; and an encapsulation layer disposed on the display element layer.

A touch sensor according to an exemplary embodiment of the present inventive concept and a display device including the same may make a size of the sensor electrode, disposed in one area (e.g., a round area) including a non-square boundary, small so that bridge patterns included in the sensor electrode may be disposed away from the non-square boundary, thereby improving a sensing sensitivity in the one area.

In addition, a dummy electrode included in a sensor electrode disposed in one area is connected to a dummy electrode included in a sensor electrode disposed at a center of a touch sensor to maintain continuity, thereby improving a visibility in the one area.

Effects of exemplary embodiments of the present inventive concept are not limited by what is illustrated in the above, and more various effects are included in the present specification.

DETAILED DESCRIPTION OF THE EMBODIMENTS

Figure 1:
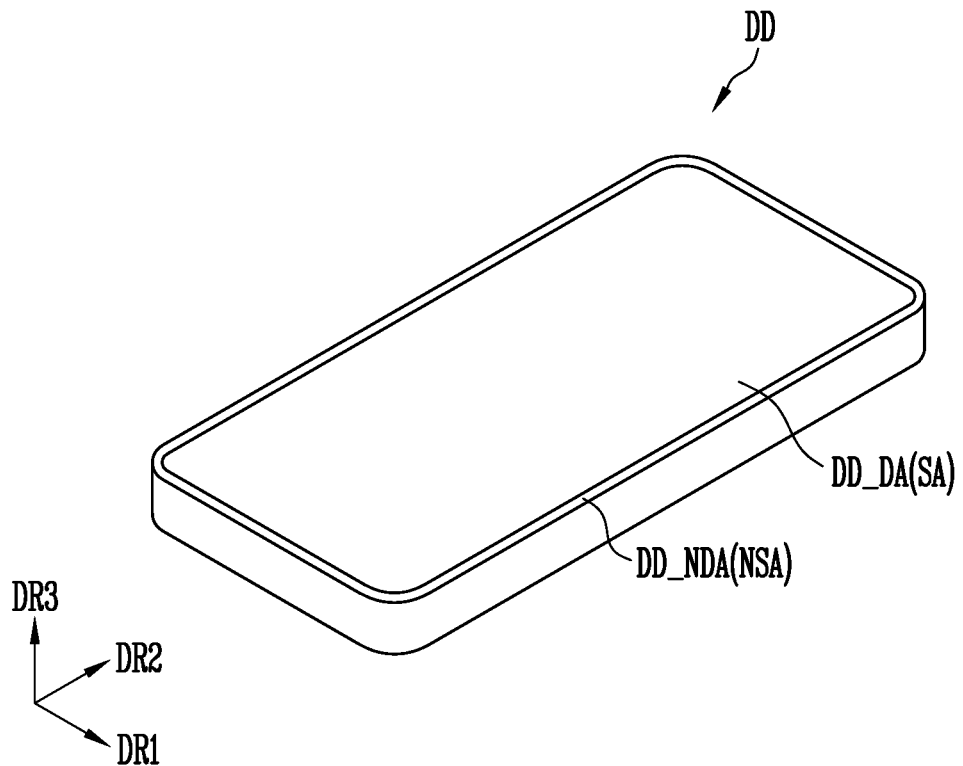
FIG. 1 is a perspective view showing a display device according to an exemplary embodiment of the present inventive concept.

It will be apparent to those skilled in the art that various modifications and variations may be made in the present disclosure without departing from the spirit or scope of the disclosure, and specific exemplary embodiments are exemplified in the drawings and explained in the detailed description. Thus, it is intended that the present inventive concept covers the modifications and variations of this inventive concept provided they come within the scope of the present inventive concept and their equivalents.

Like reference numerals designate like elements throughout the specification. In the accompanying drawings, dimensions of structures are exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it may be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, it will be understood that when an element such as a layer, film, region, or substrate is referred to as being "beneath" another element, it may be directly beneath the other element or intervening elements may also be present.

Hereinafter, with reference to accompanying drawings, a preferred exemplary embodiment of the present inventive concept and others required for those skilled in the art to understand the contents of the present inventive concept will be described in more detail. The terms of a singular form may include plural forms unless referred to the contrary.

Figure 2:
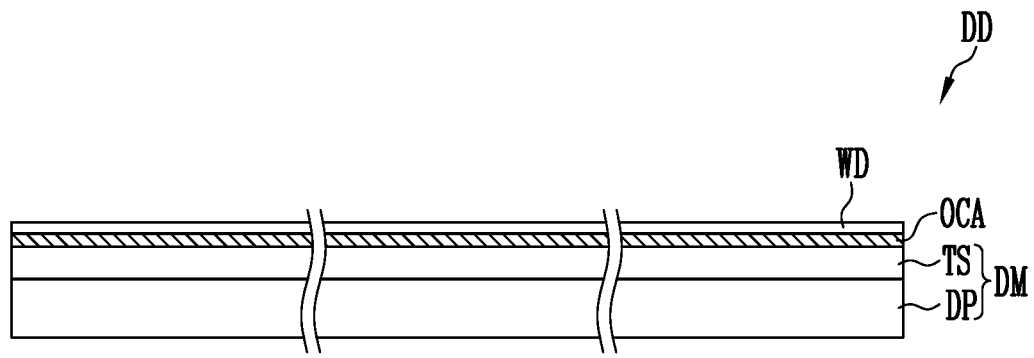
FIG. 2 is a schematic cross-sectional view of a display device shown in FIG. 1.

FIG. 1 is a perspective view showing a display device according to an exemplary embodiment of the present inventive concept and FIG. 2 is a schematic cross-sectional view of a display device shown in FIG. 1.

Referring to FIGS. 1 and 2, a display device DD may include a display module DM and a window WD.

The display device DD may be provided in various shapes, for example, a rectangular shape having two pairs of sides parallel to each other, but the present inventive concept is not limited thereto. When the display device DD is provided in the rectangular shape, one pair of sides may be provided longer than the other pair of sides. An exemplary embodiment of the present inventive concept, for better understanding and ease of description, shows a case where the display device DD has a rectangular shape with a pair of long sides and a pair of short sides, and an extending direction of the long side is referred to as DR2, an extending direction of the short side is referred to as DR1, and a direction perpendicular to the extending direction of the long side and the short side is referred to as DR3. As described above, the display device DD provided in the rectangular shape may have rounded corners at which one long side and one short side contact each other.

In an exemplary embodiment of the present inventive concept, at least a portion of the display device DD may have flexibility and the display device DD may be folded at the portion having the flexibility.

The display device DD may include a display area DD_DA for displaying an image and a non-display area DD_NDA provided at least one side of the display area DD_DA. The non-display area DD_NDA is an area where the image is not displayed.

According to an exemplary embodiment, the display device DD may include a sensing area SA and a non-sensing area NSA. The display device DD not only may display the image through the sensing area SA but also may sense the light incident from the front. The non-sensing area NSA may surround the sensing area SA, but this is an example and an exemplary embodiment is not limited thereto. In FIG. 1, the sensing area SA has a shape including rounded corners and corresponds to the display area DD_DA, but the present inventive concept is not limited thereto. According to an exemplary embodiment, some areas of the display area DD_DA may correspond to the sensing area SA.

The shape, size and disposition of the sensing area SA of the display device DD described above may be variously modified according to a sensor electrode to be described later.

The display module DM may include a display panel DP and a touch sensor TS. The touch sensor TS may be disposed directly on the display panel DP. In an exemplary embodiment of the present inventive concept, "directly disposed" may mean to be formed by a continuous process, and may also mean to attach using a separate adhesive layer. However, the present inventive concept is not limited thereto, and other layers such as an adhesive layer, a substrate, and the like may be interposed between the display panel DP and the touch sensor TS.

The display panel DP may display an image. A display panel capable of emitting light such as an organic light emitting display panel (OLED panel) may be used as the display panel DP. In addition, a non-light emitting display panel such as a liquid crystal display panel (LCD panel), an electro-phoretic display panel (EPD panel), and an electro-wetting display panel (EWD panel) may be used as the display panel DP. When a non-light emitting display panel is used as the display panel DP, the display device DD may include a backlight unit providing light to the display panel DP. In an exemplary embodiment of the present inventive concept, the display panel DP may be an organic light emitting display panel.

The touch sensor TS may be disposed on a surface in which the image of the display panel DP is displayed to receive a touch input of the user. The touch sensor TS may recognize a touch event of the display device DD through the user's hand or a separate input means. The touch sensor TS may recognize the touch event by sensing a change in a capacitance.

The touch sensor TS may sense the touch input by a mutual-capacitance method or may sense the touch input by a self-capacitance method.

A window WD may be disposed on the display module DM to protect an exposed surface of the display module DM. The window WD may protect the display module DM from an external impact and may provide an input surface and/or a display surface to the user. The window WD may be combined with the display module DM using an optical transparent adhesion member OCA.

Window WD may have a multi-layer structure selected from a glass substrate, a plastic film, or a plastic substrate. Such multi-layer structure may be directly formed on the display module DM or be separately prepared and attached to the display module DM using an adhesive layer. All or part of the window WD may have flexibility.

Figure 3:
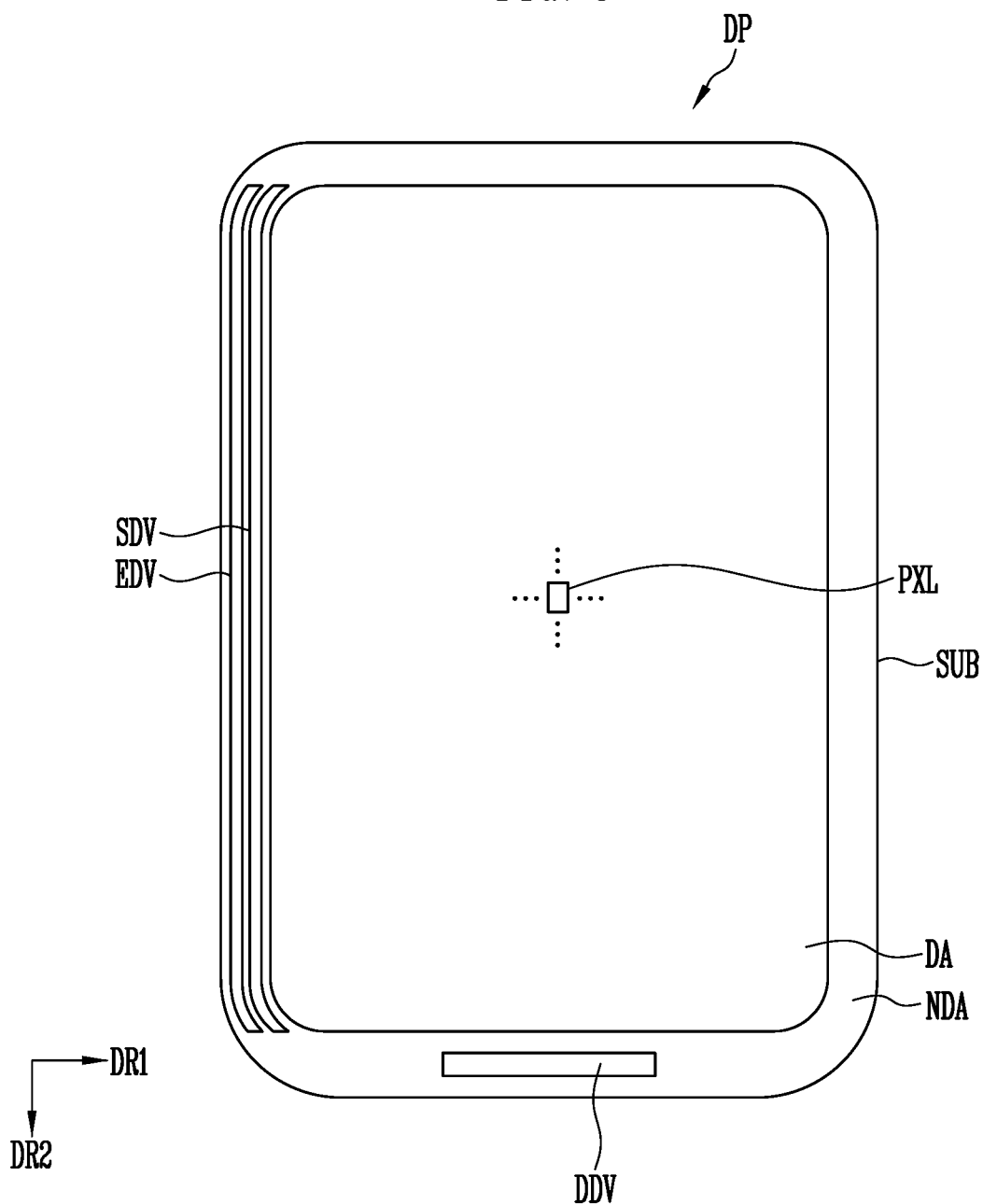
FIG. 3 is a schematic top plan view showing a display panel shown in FIG. 2.

FIG. 3 is a schematic top plan view showing a display panel shown in FIG. 2.

Referring to FIGS. 1 to 3, the display panel DP includes a substrate SUB, pixels PXL provided on the substrate SUB, a driver provided on the substrate SUB and driving the pixels PXL, and a conductive line for connecting the pixels PXL and the driver.

The substrate SUB may include one area having a substantially rectangular shape. However, the number of areas in the substrate SUB may be varied, and a shape of the substrate SUB may have a different shape according to areas provided on the substrate SUB.

The substrate SUB may include an insulating material such as glass or resin with excellent light transmittance. In addition, the substrate SUB may include a flexible material so as to be bent or folded, and may have a single-layer structure or a multi-layer structure. For example, the flexible material may include at least one of polystyrene, polyvinyl alcohol, polymethyl methacrylate, polyethersulfone, polyacrylate, polyether imide, polyetherimide, poly ethylene naphthalate, polyethylene terephthalate, polyphenylene sulfide, polyarylate, polyimide, polycarbonate, triacetate cellulose, or cellulose acetate propionate. However, a material forming the substrate SUB may be variously changed and may include fiber reinforced plastic (FRP) or the like.

The substrate SUB may include a display area DA and a non-display area NDA. The display area DA may be an area where the pixels PXL are provided to display an image, and the non-display area NDA may be an area where the pixels PXL are not provided and the image is not displayed.

The display area DA of the display panel DP may correspond to the display area DD_DA of the display device DD, and the non-display area NDA of the display panel DP may correspond to the non-display area DD_NDA of the display device DD.

A driver for driving the pixels PXL and a portion of conductive lines (not shown) for connecting the pixels PXL and the driver may be provided on the non-display area NDA. The non-display area NDA may correspond to a bezel area of the display device DD.

The display area DA may be provided in a shape corresponding to the substrate SUB. In an exemplary embodiment of the present inventive concept, the display area DA may include a non-square boundary with a predetermined curvature. For example, at least one corner of the display area DA may be formed of a curve. In addition, the display area DA itself may be circular or elliptical. Alternatively, the display area DA may be in a form of polygon such as a pentagon, hexagon, octagon, or the like. That is, the corner with non-square boundary of the display area DA may have obtuse or acute angles. In addition, the display area DA may have a trench (or notch) portion according to exemplary embodiments.

The pixels PXL may be provided in the display area DA of the substrate SUB. Each of the pixels PXL may be a minimum unit that displays an image. The pixels PXL may include an organic light emitting element emitting white light and/or color light. Each of the pixels PXL may emit one of red, green, and blue, but is not limited thereto, and may emit colors such as cyan, magenta, yellow, or the like.

The pixels PXL may be arranged in a matrix form in a row extending in the first direction DR1 and a column extending in the second direction DR2 intersecting the first direction DR1. However, a configuration of the pixels PXL is not particularly limited and the pixels PXL may be arranged in various forms.

The driver provides a signal to each of the pixels PXL through the conductive line and controls the driving of the pixels PXL. For better understanding and ease of description, the conductive line is omitted in FIG. 3, and the conductive line will be described later with reference to FIG. 4.

The driver may include a scan driver SDV that transfers a scan signal to each of the pixels PXL connected to a scan line, a light emission driver EDV that provides a light emission control signal to each of the pixels PXL connected to a light emission control line, a data driver DDV that provides a data signal to each of the pixels PXL connected to a data line, and a timing controller (not shown). The timing controller controls the scan driver SDV, the light emission driver EDV and the data driver DDV.

Figure 4:
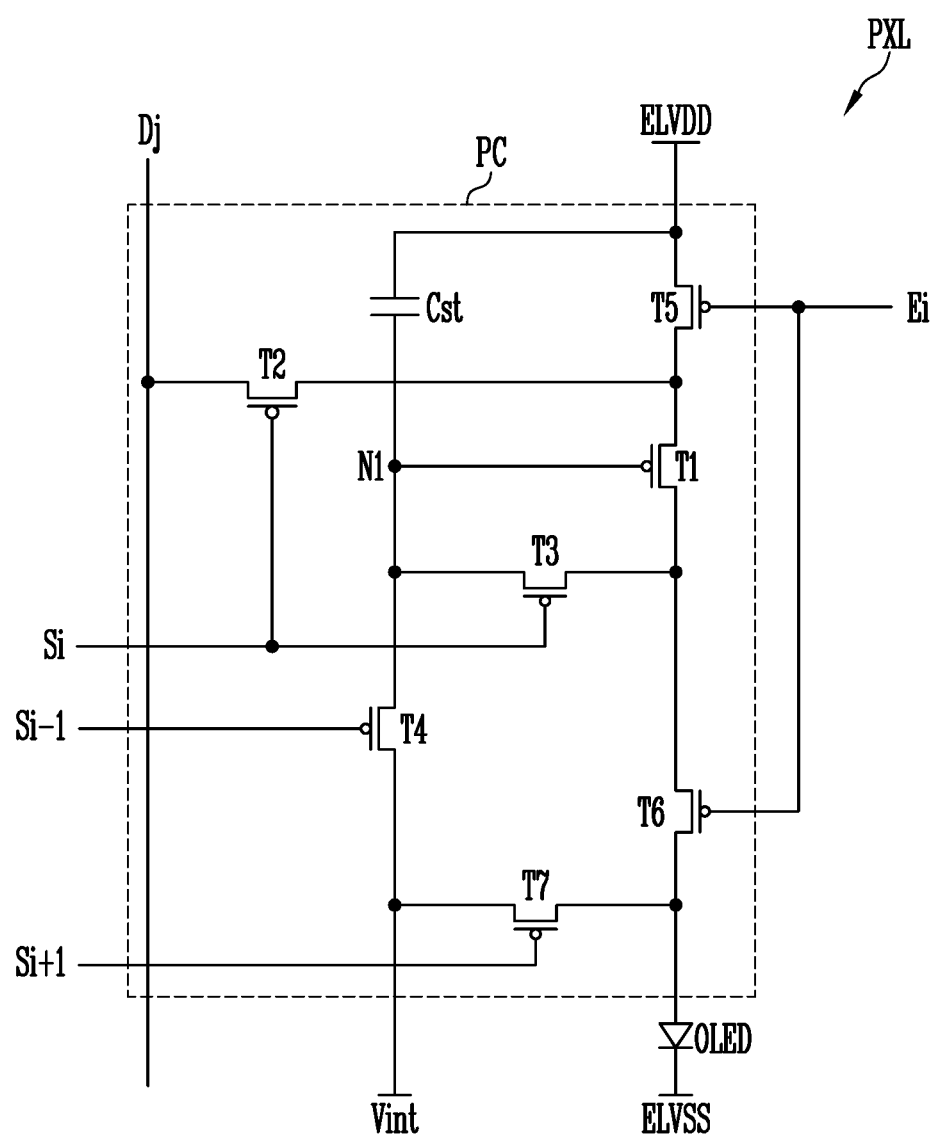
FIG. 4 is an equivalent circuit showing an electrical connection of constituent elements included in one pixel shown in FIG. 3.

FIG. 4 is an equivalent circuit showing an electrical connection of constituent elements included in one pixel shown in FIG. 3.

Referring to FIGS. 1 to 4, each of the pixels PXL may include a light emitting element OLED and a pixel circuit PC for driving the light emitting element OLED. In an exemplary embodiment of the present inventive concept, the light emitting element OLED may refer to an organic light emitting diode.

The pixel circuit PC may be connected to a scan line Si and a data line Dj of the corresponding pixel PXL. For example, when a pixel PXL is disposed at an i-th (i is a natural number) row and a j-th (j is a natural number) column of the display area DA of the display panel DP, the pixel circuit PC of the pixel PXL may be connected to the i-th scan line Si and the j-th data line Dj of the display area DA. In addition, according to exemplary embodiments, the pixel circuit PC may be further connected to at least one scan line other than the i-th scan line Si. For example, one pixel PXL disposed in the i-th row of the display area DA of the display panel DP may be further connected to an i−1-th scan line Si−1 and/or an i+1-th scan line Si+1. In addition, according to exemplary embodiments, the pixel circuit PC may be connected to a third power supply in addition to first and second pixel power supplies ELVDD and ELVSS. For example, the pixel circuit PC may also be connected to an initialization power supply Vint.

The pixel circuit PC may include first to seventh transistors T1 to T7 and a storage capacitor Cst.

One electrode of a first transistor T1 (or a driving transistor), for example, a source electrode may be connected to a power supply line to which the first pixel power supply ELVDD is applied via a fifth transistor T5, and another electrode of the first transistor T1, for example, a drain electrode may be connected to the light emitting element OLED via a sixth transistor T6. Then, a gate electrode of the first transistor T1 may be connected to a first node N1. The first transistor T1 controls a driving current flowing between the first pixel power supply ELVDD and the second pixel power supply ELVSS via the light emitting element OLED in response to a voltage of the first node N1.

A second transistor T2 (or a switching transistor) may be connected between the j-th data line Dj connected to the pixel PXL and the source electrode of the first transistor T1. Then, a gate electrode of the second transistor T2 may be connected to the i-th scan line Si connected to the pixel PXL. The second transistor T2 may be turned on when a scan signal of a gate-on voltage (e.g., a low voltage) is supplied from the i-th scan line Si to electrically connect the j-th data line Dj to the source electrode of the first transistor T1. Therefore, when the second transistor T2 is turned on, a data signal supplied from the j-th data line Dj is transferred to the source electrode of the first transistor T1.

A third transistor T3 may be connected between the drain electrode of the first transistor T1 and the first node N1. Then, a gate electrode of the third transistor T3 may be connected to the i-th scan line Si. The third transistor T3 may be turned on when a scan signal of a gate-on voltage is supplied from the i-th scan line Si to electrically connect the drain electrode of the first transistor T1 and the first node N1.

A fourth transistor T4 may be connected between the first node N1 and an initialization power supply line to which the initialization power supply Vint is applied. Then, a gate electrode of the fourth transistor T4 may be connected to a previous scan line, for example, the i−1-th scan line Si−1. The fourth transistor T4 may be turned on when a scan signal of a gate-on voltage is supplied to the i−1-th scan line Si−1 to transfer a voltage of the initialization power supply Vint to the first node N1. Here, the initialization power supply Vint may have a voltage lower than the lowest voltage of the data signal.

The fifth transistor T5 may be connected between the first pixel power supply ELVDD and the first transistor T1. Then, a gate electrode of the fifth transistor T5 may be connected to a corresponding light emission control line, for example, an i-th light emission control line Ei. The fifth transistor T5 may be turned off when the light emission control signal of a gate-off voltage is supplied to the i-th light emission control line Ei and may be turned when a gate-on voltage is supplied to the i-th light emission control line Ei.

A sixth transistor T6 may be connected between the first transistor T1 and the light emitting element OLED. Then, a gate electrode of the sixth transistor T6 may be connected to the i-th light emission control line Ei. The sixth transistor T6 may be turned off when the light emission control signal of a gate-off voltage is supplied to the i-th light emission control line Ei, and may be turned on when a gate-on voltage is supplied to the i-th light emission control line Ei.

A seventh transistor T7 may be connected between the light emitting element OLED and the initialization power supply line to which the initialization power supply Vint is applied. A gate electrode of the seventh transistor T7 may be connected to one of the scan lines of the next stage, for example, an i+1-th scan line Si+1. The seventh transistor T7 may be turned on when a scan signal of a gate-on voltage is supplied to the i+1-th scan line Si+1 to supply a voltage of the initialization power supply Vint to the light emitting element OLED.

The storage capacitor Cst may be connected between the first pixel power supply ELVDD and the first node N1. The storage capacitor Cst may store a voltage corresponding to the data signal supplied to the first node N1 and a threshold voltage of the first transistor T1 in each frame period.

An anode of the light emitting element OLED may be connected to the first transistor T1 via the sixth transistor T6 and a cathode of the light emitting element OLED may be connected to the second pixel power supply ELVSS. The light emitting element OLED may generate light of a predetermined luminance in response to an amount of current supplied from the first transistor T1. The first pixel power supply ELVDD may be set to a higher voltage than the second pixel power supply ELVSS so that a current may flow through the light emitting element OLED. A potential difference between the first pixel power supply ELVDD and the second pixel power supply ELVSS may be set to be equal to or higher than a threshold voltage of the light emitting element OLED during a light emitting period of the pixel PXL.

Figure 5:
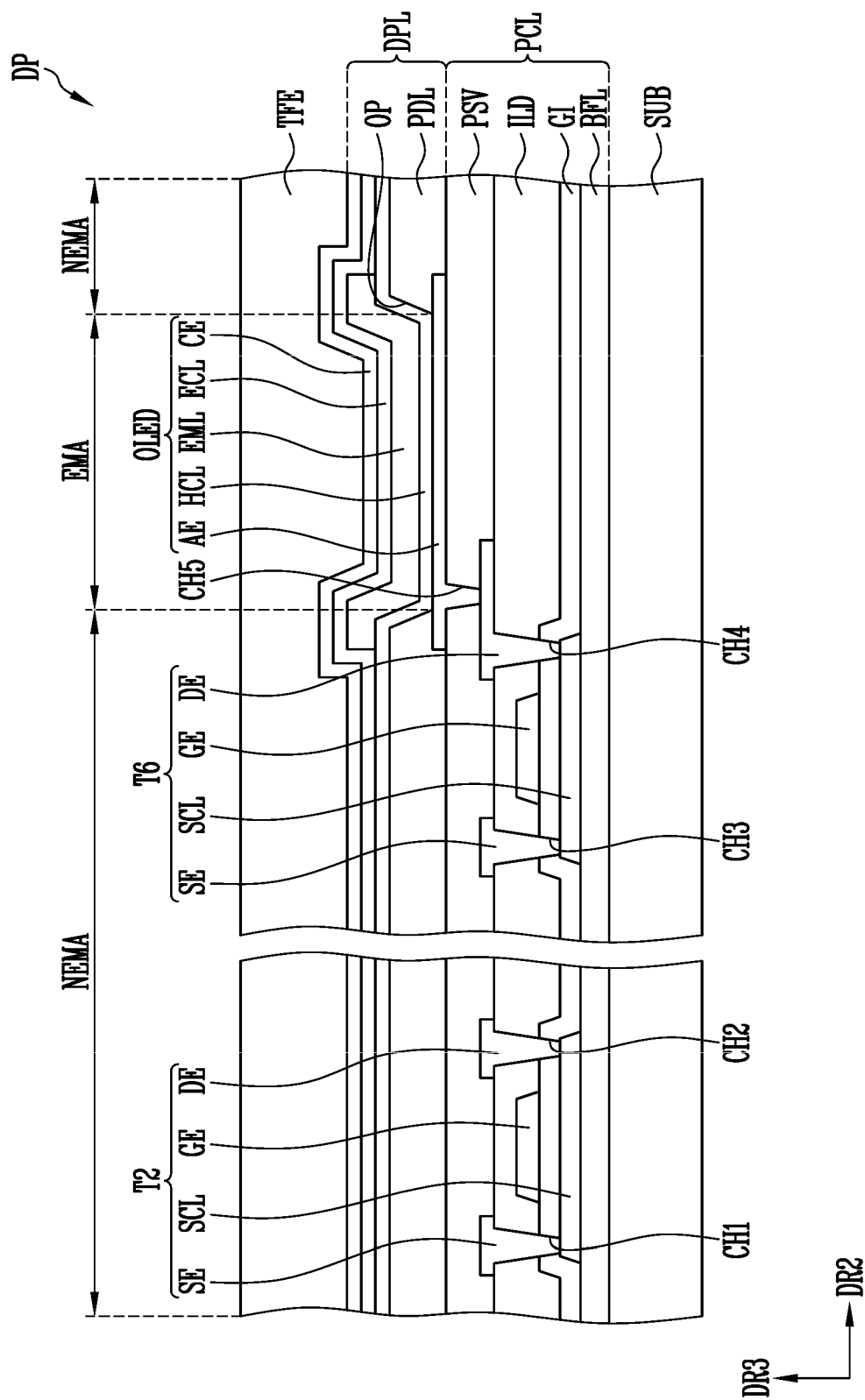
FIG. 5 is an enlarged cross-sectional view of a portion of a display panel shown in FIG. 3.

FIG. 5 is an enlarged cross-sectional view of a portion of a display panel shown in FIG. 3.

For better understanding and ease of description, FIG. 5 shows only a cross-section of a portion corresponding to each of the second and sixth transistors among the first to seventh transistors shown in FIG. 4.

Referring to FIGS. 1 to 5, the display panel DP may include a substrate SUB, a pixel circuit layer PCL, a display element layer DPL, and a thin film encapsulation layer TFE.

The substrate SUB may include insulating materials such as glass, organic polymers, quartz, or the like. In addition, the substrate SUB may be formed of a flexible material so as to be bent or folded, and may have a single-layer structure or a multi-layer structure.

The pixel circuit layer PCL may include a buffer layer BFL, the second and sixth transistors T2 and T6, and a passivation layer PSV.

The buffer layer BFL may be provided on the substrate SUB and may prevent impurities from diffusing into the second and sixth transistors T2 and T6. The buffer layer BFL may be provided as a single layer but may be provided as multiple layers of at least two layers or more. The buffer layer BFL may be omitted according to a material and a process condition of the substrate SUB.

Each of the second and sixth transistors T2 and T6 may include a semiconductor layer SCL, a gate electrode GE, a source electrode SE, and a drain electrode DE.

The semiconductor layer SCL of each of second and sixth transistors T2 and T6 may be provided on the buffer layer BFL. The semiconductor layer SCL may include source region and drain region that are in contact with the source electrode SE and the drain electrode DE, respectively. A region between the source region and the drain region may be a channel region.

The semiconductor layer SCL may be a semiconductor pattern formed of polysilicon, amorphous silicon, oxide semiconductor, or the like. The channel region may be an intrinsic semiconductor pattern that is not doped with the impurity. Here, the impurity may be n-type impurity, p-type impurity, or other impurity such as metal. The source region and the drain region may be semiconductor patterns highly doped with the impurity.

The gate electrode GE of each of second and sixth transistors T2 and T6 may be provided on a corresponding semiconductor layer SCL with a gate insulating layer GI interposed therebetween.

The source electrode SE of each of the second and sixth transistors T2 and T6 may contact the source region of the corresponding semiconductor layer SCL through a contact hole passing through an interlayer insulating layer ILD and the gate insulating layer GI. For example, the source electrode SE of the second transistor T2 may contact the source region of the corresponding semiconductor layer SCL through a first contact hole CH1 passing through the interlayer insulating layer ILD and the gate insulating layer GI, and the source electrode SE of the sixth transistor T6 may contact the source region of the corresponding semiconductor layer SCL through a third contact hole CH3 passing through the interlayer insulating layer ILD and the gate insulating layer GI.

The drain electrode DE of each of the second and sixth transistors T2 and T6 may contact the drain region of the corresponding semiconductor layer SCL through a contact hole passing through the interlayer insulating layer ILD and the gate insulating layer GI. For example, the drain electrode DE of the second transistor T2 may contact the drain region of the corresponding semiconductor layer SCL through a second contact hole CH2 passing through the interlayer insulating layer ILD and the gate insulating layer GI, and the drain electrode DE of the sixth transistor T6 may contact the drain region of the corresponding semiconductor layer SCL through a fourth contact hole CH4 passing through the interlayer insulating layer ILD and the gate insulating layer GI.

In an exemplary embodiment of the present inventive concept, each of the interlayer insulating layer ILD and the gate insulating layer GI may be formed of an inorganic insulating layer including an inorganic material or an organic insulating layer including an organic material.

The passivation layer PSV may be provided on the second and sixth transistors T2 and T6 to cover the second and sixth transistors T2 and T6. The passivation layer PSV may include a fifth contact hole CH5 exposing a portion of a drain electrode DE of the sixth transistor T6.

The display element layer DPL may include the light emitting element OLED provided on the passivation layer PSV and emitting light.

The light emitting element OLED may include first and second electrodes AE and CE and an emission layer EML provided between the two electrodes AE and CE. Here, one of the first electrode and second electrodes AE and CE may be an anode, and the other thereof may be a cathode. For example, the first electrode AE may be the anode and the second electrode CE may be the cathode. When the light emitting element OLED is a front light emitting organic light emitting element, the first electrode AE may be a reflective electrode and the second electrode CE may be a transmissive electrode. In an exemplary embodiment of the present inventive concept, a case in which a light emitting element OLED is a front light emitting organic light emitting element and the first electrode AE is an anode described as an exemplary embodiment.

The first electrode AE may be electrically connected to the drain electrode DE of the sixth transistor T6 through a fifth contact hole CH5 passing through the passivation layer PSV. The first electrode AE may include a reflective layer (not shown) that may reflect light and a transparent conductive layer (not shown) that is disposed above or below the reflective layer. At least one of the transparent conductive layer and the reflective layer may be electrically connected to the drain electrode DE of the sixth transistor T6.

The display element layer DPL may further include a pixel definition layer PDL with an opening OP exposing a portion of the first electrode AE, for example an upper surface of the first electrode AE.

Each pixel PXL provided in the display panel DP may be disposed on the pixel area included in the display area DA. In an exemplary embodiment of the present inventive concept, the pixel area may include a light emitting area EMA and a non-light emitting area NEMA adjacent to the light emitting area EMA. The non-light emitting area NEMA may surround the light emitting area EMA. In an exemplary embodiment of the present inventive concept, the light emitting area EMA may be an area of the first electrode AE exposed by the opening OP of the pixel definition layer PDL.

The display element layer DPL may include a hole control layer HCL and an electron control layer ECL.

The hole control layer HCL may be disposed commonly in the light emitting area EMA and the non-light emitting area NEMA. Although not separately shown, a common layer such as the hole control layer HCL may be formed commonly to a plurality of pixels PXL.

The emission layer EML may be disposed on the hole control layer HCL. The emission layer EML may be disposed in an area corresponding to the opening OP of the pixel definition layer PDL. That is, the emission layer EML may be provided separately to each of a plurality of pixels PXL. The emission layer EML may include organic and/or inorganic materials. The patterned emission layer EML are illustrated in an exemplary embodiment of the present inventive concept, but the emission layer EML may be provided commonly to the pixels PXL according to exemplary embodiments. The color of the light generated in the emission layer EML may be one of red, green, blue, and white, but is not limited thereto. For example, the color of light generated in the emission layer EML may be one of magenta, cyan, and yellow.

An electron control layer ECL may be provided on the emission layer EML. The electron control layer ECL may be formed commonly to the pixels PXL and may serve to inject and/or transport electrons into the emission layer EML.

The second electrode CE may be provided on the electron control layer ECL. The second electrode CE may be provided commonly to the pixels PXL.

The thin film encapsulation layer TFE covering the second electrode CE may be provided on the second electrode CE.

The thin film encapsulation layer TFE may be formed of a single layer, but may be also formed of a multiple layer. The thin film encapsulation layer TFE may include a plurality of insulating layers covering the light emitting element OLED. For example, the thin film encapsulation layer TFE may include at least one inorganic layer and at least one organic layer. For example, the thin film encapsulation layer TFE may have a structure in which an inorganic layer and an organic layer are alternately stacked. According to an exemplary embodiment, the thin film encapsulation layer TFE may be an encapsulation substrate that is disposed on the light emitting element OLED and bonded to the substrate SUB through a sealant.

Figure 6:
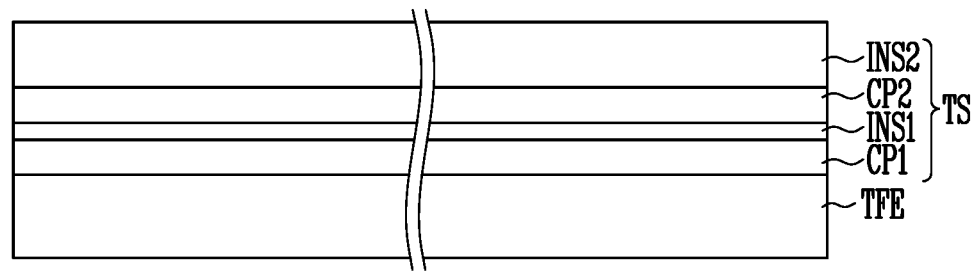
FIG. 6 is a schematic cross-sectional view of a touch sensor shown in FIG. 2.

FIG. 6 is a schematic cross-sectional view of a touch sensor shown in FIG. 2.

Referring to FIGS. 1 to 6, the touch sensor TS may include a first conductive pattern CP1, a first insulating layer INS1, a second conductive pattern CP2, and a second insulating layer INS2.

The first conductive pattern CP1 may be directly disposed on the thin film encapsulation layer TFE of the display panel DP, but the present inventive concept is not limited thereto. According to an exemplary embodiment, another inorganic insulating layer may be disposed between the first conductive pattern CP1 and the thin film encapsulation layer TFE, and the first conductive pattern CP1 may be directly disposed on the inorganic insulating layer in this case.

Each of the first and second conductive patterns CP1 and CP2 may have a single-layer structure or may have a multi-layer structure stacked in a thickness direction. The conductive pattern of a single-layer structure may include a metal layer or a transparent conductive layer. The metal layer may include molybdenum, silver, titanium, copper, aluminum, or alloys thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layers may include PEDOT, metal nano wire, or graphene.

The conductive pattern of the multi-layer structure may include multi-layered metal layers. The multi-layered metal layers may have a three-layer structure, for example titanium/aluminum/titanium. The conductive pattern of the multi-layer structure may include a single metal layer and a transparent conductive layer. The conductive pattern of the multi-layer structure may include multi-layered metal layers and a transparent conductive layer.

In an exemplary embodiment of the present inventive concept, each of the first and second conductive patterns CP1 and CP2 may include sensor patterns and sensing lines.

Each of the first insulating layer INS1 and the second insulating layer INS2 may include an inorganic insulating layer including an inorganic material or an organic insulating layer including an organic material. The inorganic insulating layer may include at least one of aluminum oxide, titanium oxide, silicon oxide, silicon nitride, silicon oxynitride, zirconium oxide, or hafnium oxide. The organic insulating layer may include at least one of an acryl-based resin, a methacryl-based resin, a polyisoprene, a vinyl-based resin, an epoxy-based resin, a urethane-based resin, a cellulose-based resin, siloxane-based resin, a polyimide-based resin, a polyamide-based resin, or a perylene-based resin.

Figure 7:
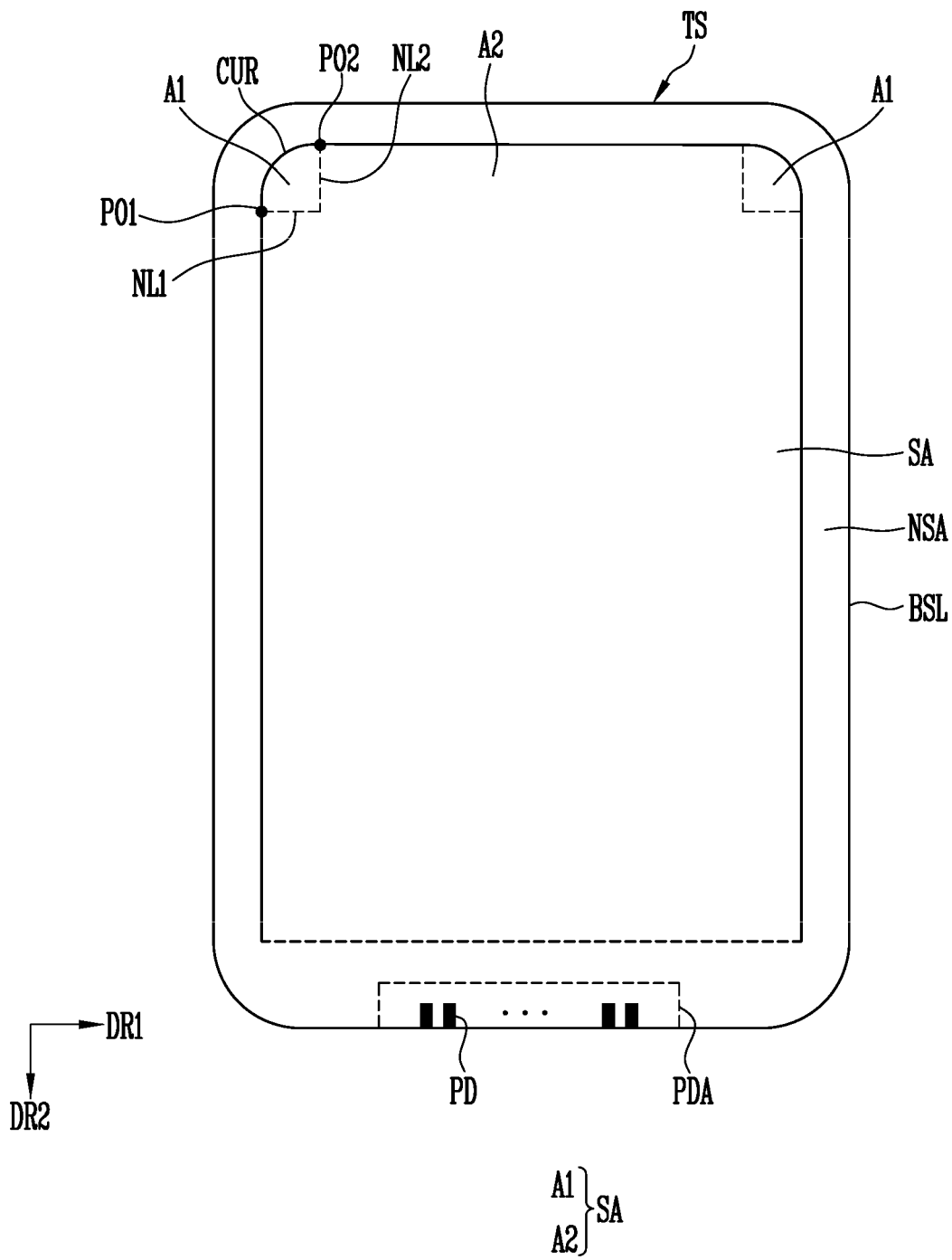
FIG. 7 is a schematic top plan view of a touch sensor shown in FIG. 2.

FIG. 7 is a schematic top plan view of a touch sensor shown in FIG. 2.

Referring to FIG. 7, the touch sensor TS may include a base layer BSL including a sensing area SA capable of sensing a touch input and a non-sensing area NSA surrounding at least a portion of the sensing area SA.

The base layer BSL may be formed of reinforced glass, transparent plastic, transparent film, or the like.

The sensing area SA may be provided in a center area of the base layer BSL so as to overlap the display area DA of the display panel DP. The sensing area SA may be provided in a shape substantially equivalent to a shape of the display area DA, but the present inventive concept is not limited thereto. A sensor electrode (not shown) for sensing a touch input is provided and/or formed in the sensing area SA.

The non-sensing area NSA may be provided at an edge of the base layer BSL so as to overlap the non-display area NDA of the display panel DP. Sensing lines (not shown) that are electrically connected to the sensor electrode to receive and transfer a touch sensing signal are provided and/or formed on the non-sensing area NSA. In addition, a pad area PDA that is connected to the sensing lines to be electrically connected to the sensor electrode of the sensing area SA is disposed on the non-sensing area NSA. The pad area PDA may include a plurality of pads PD.

In an exemplary embodiment of the present inventive concept, the sensing area SA may include a first sensing area A1 and a second sensing area A2.

The first sensing area A1 may be an area including a curve CUR (i.e., a non-square boundary or a rounded corner) with a predetermined curvature in the sensing area SA, and the second sensing area A2 may be an area other than the first sensing area A1 in the sensing area SA. That is, the second sensing area A2 may be an area that does not include the curve CUR (i.e., a non-square boundary or a rounded corner). As shown in FIG. 7, the first sensing area A1 may be at least one corner surrounded by the curve CUR (i.e., a non-square boundary or a rounded corner) with a predetermined curvature.

The first sensing area A1 may be an area of a sector formed by an arc. That is an area which is surrounded by the curve CUR, a first line NL1 extending parallel to a first direction from one end PO1 (a first contact point that contacts one of a pair of long sides forming the second sensing area A2) of the curve CUR, and a second line NL2 extending parallel to a second direction from the other end PO2 (a second contact that contacts one of a pair of short sides forming the second sensing area A2) of the curve CUR.

Figure 8:
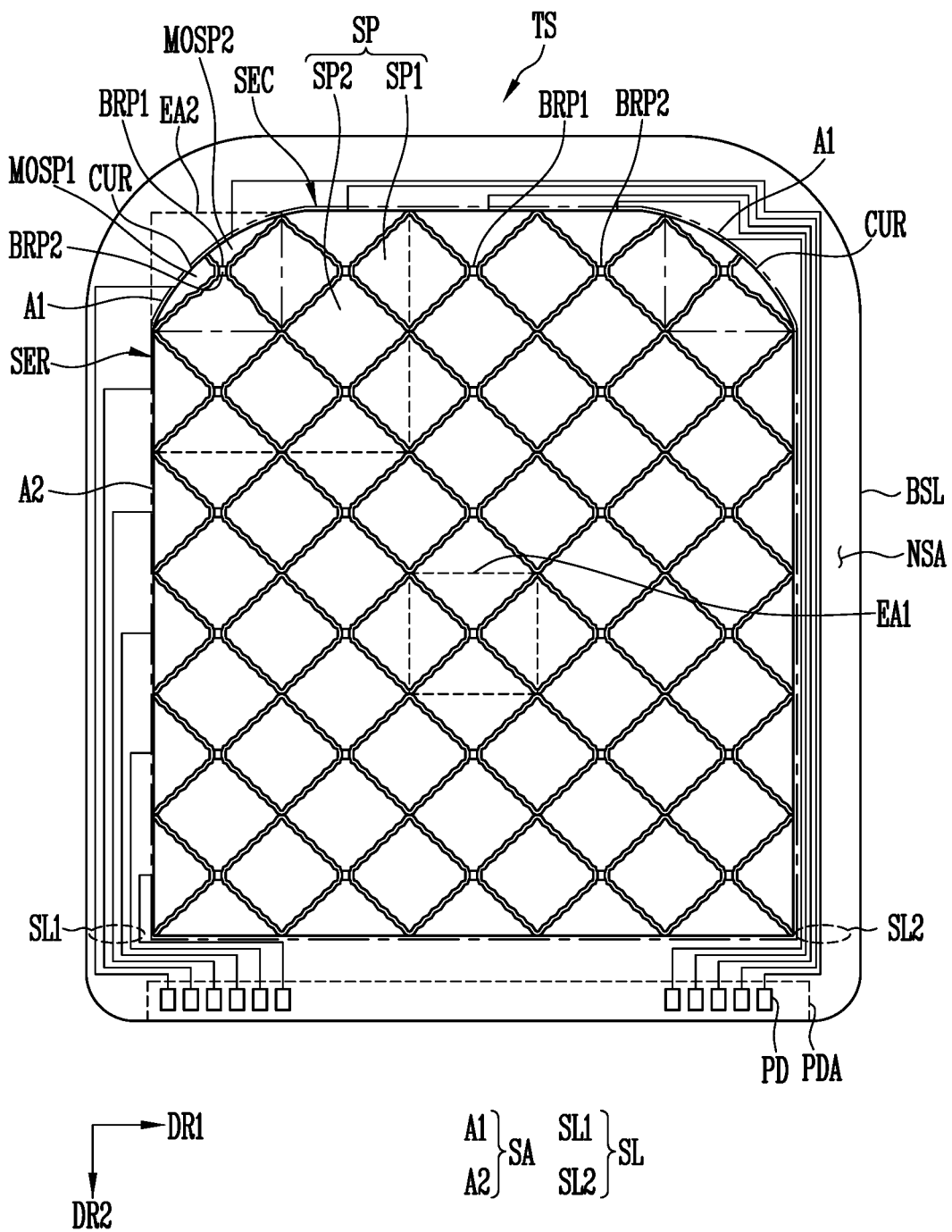
FIG. 8 is a top plan view showing a touch sensor shown in FIG. 7 in more detail.
Figure 9:
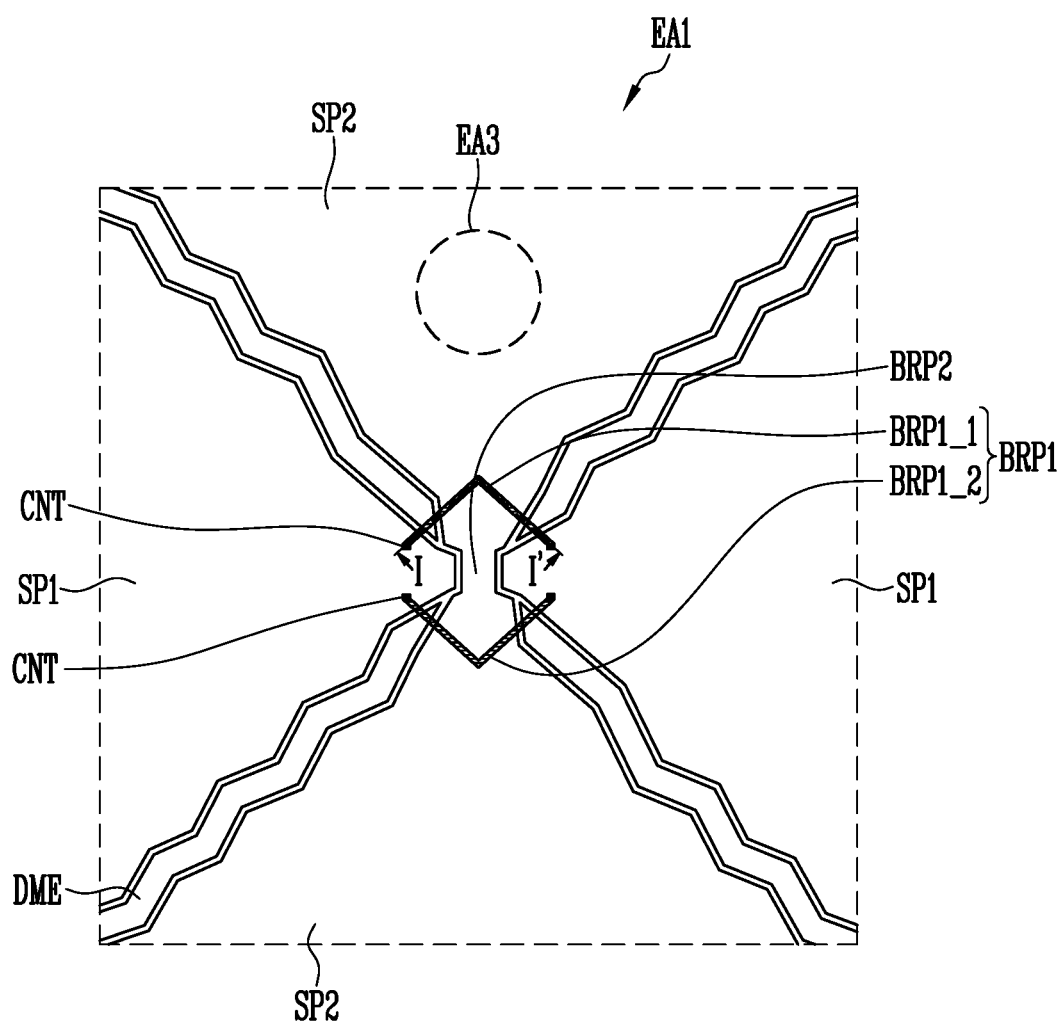
FIG. 9 is an enlarged schematic top plan view showing an example of a portion EA1 of FIG. 8
Figure 10:
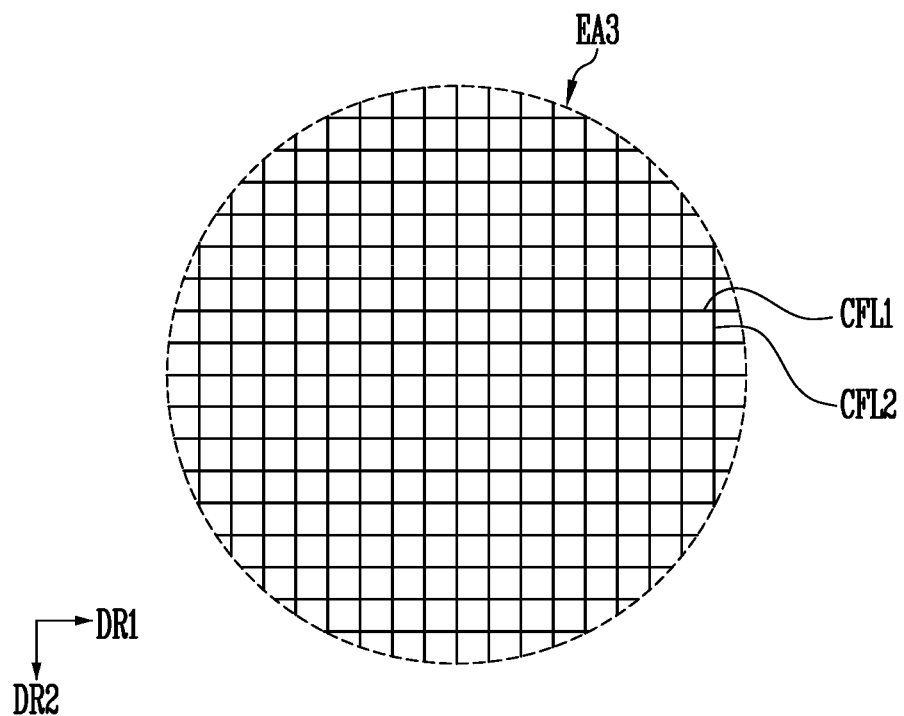
FIG. 10 is an enlarged schematic top plan view showing an example of a portion EA3 of FIG. 9.
Figure 11A:
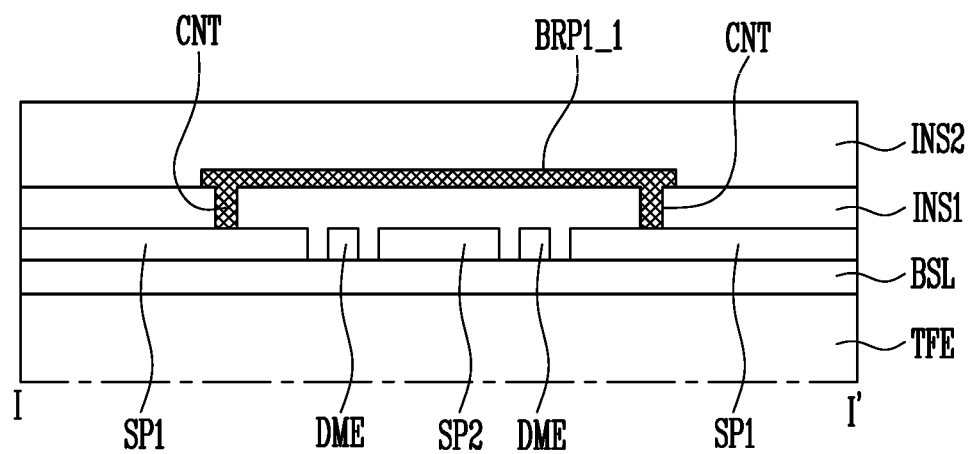
FIG. 11A is a cross-sectional view taken along a line I-I' of FIG. 9.
Figure 11B:
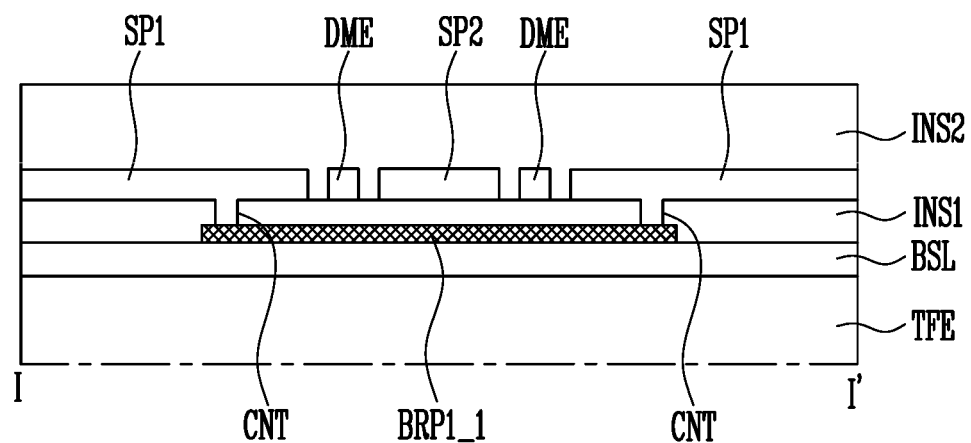
FIG. 11B shows an arrangement relation between first and second sensor patterns and first and second bridge patterns of FIG. 9 according to another exemplary embodiment and is a cross-sectional view corresponding to line I-I' of FIG. 9.

FIG. 8 is a top plan view showing a touch sensor shown in FIG. 7 in more detail, FIG. 9 is an enlarged schematic top plan view showing an example of a portion EA1 of FIG. 8, FIG. 10 is an enlarged schematic top plan view showing an example of a portion EA3 of FIG. 9, FIG. 11A is a cross-sectional view taken along a line I-I' of FIG. 9, and FIG. 11B shows an arrangement relation between first and second sensor patterns and first and second bridge patterns of FIG. 9 according to another exemplary embodiment and is a cross-sectional view corresponding to line I-I' of FIG. 9.

Referring to FIGS. 1 to 11B, the touch sensor TS may include a base layer BSL which includes the sensing area SA and the non-sensing area NSA.

The sensing area SA may include the first sensing area A1 and the second sensing area A2. The first sensing area A1 may be an area including the curve CUR with a predetermined curvature, and the second sensing area A2 may be an area other than the first sensing area A1. That is, the second sensing area A2 may be an area that does not include the curve CUR.

In an exemplary embodiment of the present inventive concept, the curve CUR may be formed by cutting a portion of the base layer BSL in a cutting process for changing a shape of the touch sensor TS. That is, the curve CUR may correspond to a cutting line formed by cutting a portion of the base layer BSL to change the shape of the sensing area SA, and the shape of the base layer BSL may have a non-square boundary on at least one corner of the base layer BSL. Thus, the at least one corner of the sensing area SA may be the first sensing area A1 including the curve CUR. As shown in FIG. 8, the curve CUR may be disposed at each corner of the sensing area SA.

In an exemplary embodiment of the present inventive concept, the first sensing area A1 may be defined (or partitioned) as an area of a sector formed by an arc. That is an area which is surrounded by the curve CUR, the first line NL1 and the second line NL2.

Sensor electrodes may be provided and/or formed on the sensing area SA, and a plurality of sensing lines SL connecting the sensor electrodes to the pads PD in the pad area PDA may be provided and/or formed on the non-sensing area NSA. The pad area PDA may include a plurality of pads PD. The pad area PDA may be electrically connected to the sensor electrodes of the sensing area SA through the sensing lines SL.

The sensor electrode may include a plurality of sensor patterns SP and first and second bridge patterns BRP1 and BRP2.

The sensor patterns SP may include a plurality of first sensor patterns SP1 and a plurality of second sensor patterns SP2 electrically insulated from the first sensor patterns SP1.

The first sensor patterns SP1 may be arranged in the first direction DR1, and may be electrically connected to a first sensor patterns SP1 adjacent thereto through the first bridge pattern BRP1 to form at least one sensor row SER. The second sensor patterns SP2 may be arranged in the second direction DR2 crossing the first direction DR1, and may be electrically connected to a second sensor patterns SP2 adjacent thereto through the second bridge pattern BRP2 to form at least one sensor column SEC.

Each of the first and second sensor patterns SP1 and SP2 may be electrically connected to one pad PD through the corresponding sensing line SL.

The sensing lines SL may include a plurality of first sensing lines SL1 connected to the first sensor patterns SP1 and a plurality of second sensing lines SL2 connected to the second sensor patterns SP2. In an exemplary embodiment of the present inventive concept, each of the first sensor patterns SP1 may receive a driving signal for touch sensing through the corresponding first sensing line SL1, and each of the second sensor patterns SP2 may transfer a touch sensing signal through the corresponding second sensing line SL2. However, the present inventive concept is not limited thereto and vice versa. For example, each of the second sensor patterns SP2 may receive a driving signal for touch sensing through the corresponding second sensing line SL2, and each of the first sensor patterns SP1 may transfer a touch sensing signal through the corresponding first sensing line SL1.

In an exemplary embodiment of the present inventive concept, the touch sensor TS may recognize a touch of the user by sensing an amount of change in a mutual capacitance formed between the first and second sensor patterns SP1 and SP2.

In an exemplary embodiment of the present inventive concept, each second sensor pattern SP2 may include a plurality of conductive fine lines CFL1 and CFL2 as shown in FIG. 10

For example, the second sensor patterns SP2 may include a plurality of first conductive fine lines CFL1 extending in the first direction DR1 and parallel to each other, and a plurality of second conductive fine lines CFL2 extending in the second direction DR2 and parallel to each other. Due to the first conductive fine lines CFL1 and second conductive fine lines CFL2, each of the second sensor patterns SP2 may have a mesh structure. The mesh structure may include a plurality of openings, for example, areas formed by crossing the first conductive fine lines CFL1 and second conductive fine lines CFL2.

Each of the second sensor patterns SP2 is illustrated as having the mesh structure in the drawing, but the present inventive concept is not limited thereto. For example, the first sensor patterns SP1, and the first and second bridge patterns BRP1 and BRP2 may also be formed of a mesh structure including the first and second conductive fine lines CFL1 and CFL2.

When the first and second sensor patterns SP1 and SP2 have a mesh structure, an area where the first and second sensor patterns SP1 and SP2 overlap with the display panel DP may be reduced due to the openings. In this case, an electromagnetic interference between the first and second sensor patterns SP1 and SP2 and the display panel DP may be prevented.

Each of the first bridge patterns BRP1 may electrically connect the first sensor patterns SP1 arranged in parallel in the first direction DR1, and extend in the first direction DR1. Each of the first bridge patterns BRP1 may include a 1-1-th bridge pattern BRP1_1 and a 1-2-th bridge pattern BRP1_2.

Each of the second bridge patterns BRP2 may be for electrically connecting the second sensor patterns SP2 arranged in parallel in the second direction DR2, and extend in the second direction DR2. In an exemplary embodiment of the present inventive concept, each second bridge pattern BRP2 may be provided integrally with the second sensor patterns SP2 using the same material as and the same process with the second sensor patterns. When each second bridge pattern BRP2 is provided integrally with the second sensor patterns SP2, the second bridge patterns BRP2 may be an area of the second sensor patterns SP2.

The touch sensor TS may include a first conductive pattern (see CP1 in FIG. 6) provided on the base layer BSL, a first insulating layer INS1 provided on the first conductive pattern CP1, a second conductive pattern (see CP2 in FIG. 6) provided on the first insulating layer INS1, and a second insulating layer INS2 provided on the second conductive pattern CP2.

The base layer BSL may be disposed on the thin film encapsulation layer TFE of the display panel DP as shown in FIG. 11A. The base layer BSL may include an organic insulating layer including an organic material or an inorganic insulating layer including an inorganic material. The base layer BSL may be formed of a material having flexibility so as to be bent or folded, and may have a single-layer structure or a multi-layer structure. To implement a touch screen function, the touch sensor TS may be disposed on the display panel DP for displaying an image. The touch sensor TS may be directly formed on the thin film encapsulation layer TFE. However, the touch sensor TS may be separately prepared and attached on the thin film encapsulation layer TFE by using an adhesive. The touch sensor TS may have a transparency capable of transmitting light.

According to an exemplary embodiment, the base layer BSL may be the uppermost layer of the thin film encapsulation layer TFE of the display panel DP. For example, the base layer BSL may be an inorganic insulating layer (or inorganic layer) which is the uppermost layer of the thin film encapsulation layer TFE. According to an exemplary embodiment, the base layer BSL may be an inorganic insulating layer (inorganic buffer layer) which is additionally disposed on the thin film encapsulation layer TFE. For example, the base layer BSL may include a silicon nitride layer, a silicon oxynitride layer, a silicon oxide layer, a titanium oxide layer, an aluminum oxide layer, or the like.

The first conductive pattern CP1 may be directly disposed on the base layer BSL. According to an exemplary embodiment, the first conductive pattern CP1 may be disposed to be overlapped with the pixel definition layer PDL.

The first conductive pattern CP1 may include the first sensor patterns SP1, the second sensor patterns SP2, and the second bridge patterns BRP2 as shown in FIG. 11A.

The first conductive pattern CP1 may include a conductive material. The conductive material may include a transparent conductive oxide, or metallic material. In addition, the first conductive pattern CP1 may include a plurality of stacked metal layers. The transparent conductive oxide may include indium tin oxide (ITO), indium zinc oxide (IZO), antimony zinc oxide (AZO), indium tin zinc oxide (ITZO), zinc oxide (ZnO), tin oxide (SnO2), and the like. The metallic material may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. The first conductive pattern CP1 may have a single-layer structure or a multi-layer structure.

The first insulating layer INS1 may be provided on the first conductive pattern CP1. The first insulating layer INS1 may include the same material as the base layer BSL, but is not limited thereto. In an exemplary embodiment of the present inventive concept, the first insulating layer INS1 may include an organic insulating layer including an organic material or an inorganic insulating layer including an inorganic material.

The second conductive pattern CP2 may include a single conductive material layer like the first conductive pattern CP1, or may include a plurality of stacked conductive material layers. The second conductive pattern CP2 may include the first bridge patterns BRP1 provided on the first insulating layer INS1 as shown in FIG. 11A. The first bridge patterns BRP1 may connects adjacent first sensor patterns SP1 through a contact hole CNT passing through the first insulating layer INS1.

The second insulating layer INS2 may be provided on the first insulating layer INS1 where the second conductive pattern CP2 is provided. The second insulating layer INS2 may prevent the second conductive pattern CP2 from being exposed to the outside, thereby preventing corrosion of the second conductive pattern CP2. The second insulating layer INS2 may be formed of the organic insulating layer including an organic material. The organic material may include one of acryl, polyimide (PI), polyamide (PA), or benzocyclobutene (BCB). Since the second insulating layer INS2 formed of an organic insulating layer may be transparent and have fluidity, unevenness of a lower structure under the second insulating layer may be relaxed and planarized. According to an exemplary embodiment, the second insulating layer INS2 may be formed of an inorganic insulating layer including inorganic material.

In an exemplary embodiment of the present inventive concept, the second bridge patterns BRP2, the first and second sensor patterns SP1 and SP2 are included in the first conductive pattern CP1, and the first bridge patterns BRP1 are included in the second conductive pattern CP2, but the present inventive concept is not limited thereto. According to an exemplary embodiment, the first bridge patterns BRP1 may be included in the first conductive pattern CP1, and the second bridge patterns BRP2 and the first and second sensor patterns SP1 and SP2 may be included in the second conductive pattern CP2 as shown in FIG. 11B. That is, the first bridge patterns BRP1 may be formed and/or disposed on the base layer BSL, and the second bridge patterns BRP2 and the first and second sensor patterns SP1 and SP2 may be formed and/or disposed on the first insulating layer INS1. In this case, each first sensor pattern SP1 may be connected to the corresponding first bridge patterns BRP1 through a contact holes CNT passing through the first insulating layer INS1 to electrically connected to the first sensor patterns SP1 disposed adjacent in the first direction DR1.

In addition, in an exemplary embodiment of the present inventive concept, the first conductive pattern CP1 is provided on the base layer BSL and the second conductive pattern CP2 is provided on the first insulating layer INS1, but the present inventive concept is not limited thereto. According to an exemplary embodiment, the first conductive pattern CP1 may be provided on the first insulating layer INS1, and the second conductive pattern CP2 may be provided on the base layer BSL.

In addition, in an exemplary embodiment of the present inventive concept, first and second sensor patterns SP1 and SP2 are provided on the same layer, but the present inventive concept is not limited thereto. According to an exemplary embodiment, the first sensor patterns SP1 and the second sensor patterns SP2 may be provided on different layers.

The first and second sensor patterns SP1 and SP2 and the first and second bridge patterns BRP1 and BRP2 may be formed of a light transmitting conductive layer such as ITO, IZO, or ZnO.

The sensor electrode provided and/or formed in the sensing area SA may include dummy electrodes DME disposed spaced apart between the first and second sensor patterns SP1 and SP2. The dummy electrodes DME may be formed through the same process as the first sensor patterns SP1 and the second sensor patterns SP2, so that they may include the same material as and may have the same stacked structure as the first sensor patterns SP1 and the second sensor patterns SP2. Since the dummy electrodes DME are floating electrodes which is not connected to any power source, they may be not electrically connected to the first sensor patterns SP1 and the second sensor patterns SP2. Because the dummy electrodes DME are disposed in the sensing area SA, a boundary area between the first sensor patterns SP1 and the second sensor patterns SP2 may not be recognized. In addition, a fringe effect between the first sensor patterns SP1 and the second sensor patterns SP2 may be controlled by adjusting a width and thickness of the dummy electrodes DME, and a capacitance between the first sensor patterns SP1 and the second sensor patterns SP2 may be optimized.

In an exemplary embodiment of the present inventive concept, a boundary of each of the first sensor patterns SP1, the second sensor patterns SP2, and the dummy electrodes DME may have a zigzag shape. Thus, even if the display area DA of the display panel DP is disposed overlapped with the first and second sensor patterns SP1 and SP2, the influence of the first and second sensor patterns SP1 and SP2 on the visibility of the displayed image may be reduced. Specifically, the zigzag shape may prevent a moiré phenomenon due to a repetition of a certain pattern of the first and second sensor patterns SP1 and SP2.

On the other hand, in the second area A2 of the sensing area SA, two first sensor patterns SP1 disposed at both ends of the sensor row SER among the first sensor patterns SP1 included in the sensor row SER may have a smaller size, for example, a half size than the first sensor patterns SP1 disposed at a center of the second area A2. In addition, in the second area A2 of the sensing area SA, two second sensor patterns SP2 disposed at both ends of the sensor column SEC among the second sensor patterns SP2 included in the sensor column SEC may have a smaller size, for example, a half size than the second sensor patterns SP2 disposed at a center of the second area A2. However, this is an illustrative, and the present inventive concept is not limited thereto.

In the first sensing area A1, the first and second sensor patterns SP1 and SP2 adjacent to the curve CUR (i.e., non-square boundary) may be disposed. In the following exemplary embodiment, for better understanding and ease of description, the first and second sensor patterns SP1 and SP2 adjacent to the curve CUR (i.e., non-square boundary) among the sensor patterns SP disposed on the first sensing area A1 are referred to as first and second outermost sensor patterns MOSP1 and MOSP2. A shape of the first and second outermost sensor patterns MOSP1 and MOSP2 may be arbitrarily decided according to the curvature of the curve CUR (i.e., non-square boundary).

In general, the first and second outermost sensor patterns MOSP1 and MOSP2 may have configurations decided by the shape of the sensing area SA and have areas smaller than the first and second sensor patterns SP1 and SP2 disposed adjacent to edges of the sensing area SA. Therefore, an area of the first and second outermost sensor patterns MOSP1 and MOSP2 may be reduced, thereby reducing the capacitance in the first sensing area A1 and reducing the sensing sensitivity. In the first sensing area A1, the first and second bridge patterns BRP1 and BRP2 connecting adjacent first and second outermost sensor patterns MOSP1 and MOSP2 may be partly cut off or disposed adjacent to the curve CUR (i.e., non-square boundary) depending on the curvature of the curve CUR (i.e., non-square boundary). Particularly in this case, the first and second bridge patterns BRP1 and BRP2 are disconnected due to a static electricity inflow from the outside or an external impact, thereby reducing the capacitance in the first sensing area A1 and reducing the sensing sensitivity.

Thus, the touch sensor TS according to an exemplary embodiment of the present inventive concept may be formed such that a size (or area) of the sensor patterns SP disposed to overlap a boundary between the first sensing area A1 and the second sensing area A2 is different from a size of the sensor patterns SP disposed in the second sensing area A2, thereby the first and second bridge patterns BRP1 and BRP2 disposed in the first sensing area A1 may be directed to inward direction (e.g., second sensing area A2). That is, the touch sensor TS according to an exemplary embodiment of the present inventive concept may dispose the first and second bridge patterns BRP1 and BRP2 disposed in the first sensing area A1 as far as possible from a curve CUR (i.e., non-square boundary). In this case, when a shape of the sensing area SA is changed, a damage of the first and second bridge patterns BRP1 and BRP2 disposed in the first sensing area A1 may be minimized to ensure sufficient capacitance in the first sensing area A1. Thus, the sensing sensitivity in the first sensing area A1 may be improved. An exemplary embodiment in which the sensor patterns SP disposed to overlap a boundary between the first sensing area A1 and the second sensing area A2 of the touch sensor TS have different sizes from the sensor patterns SP disposed at the second sensing area A2 will be described in detail with reference to FIGS. 12A and 12B.

Figure 12A:
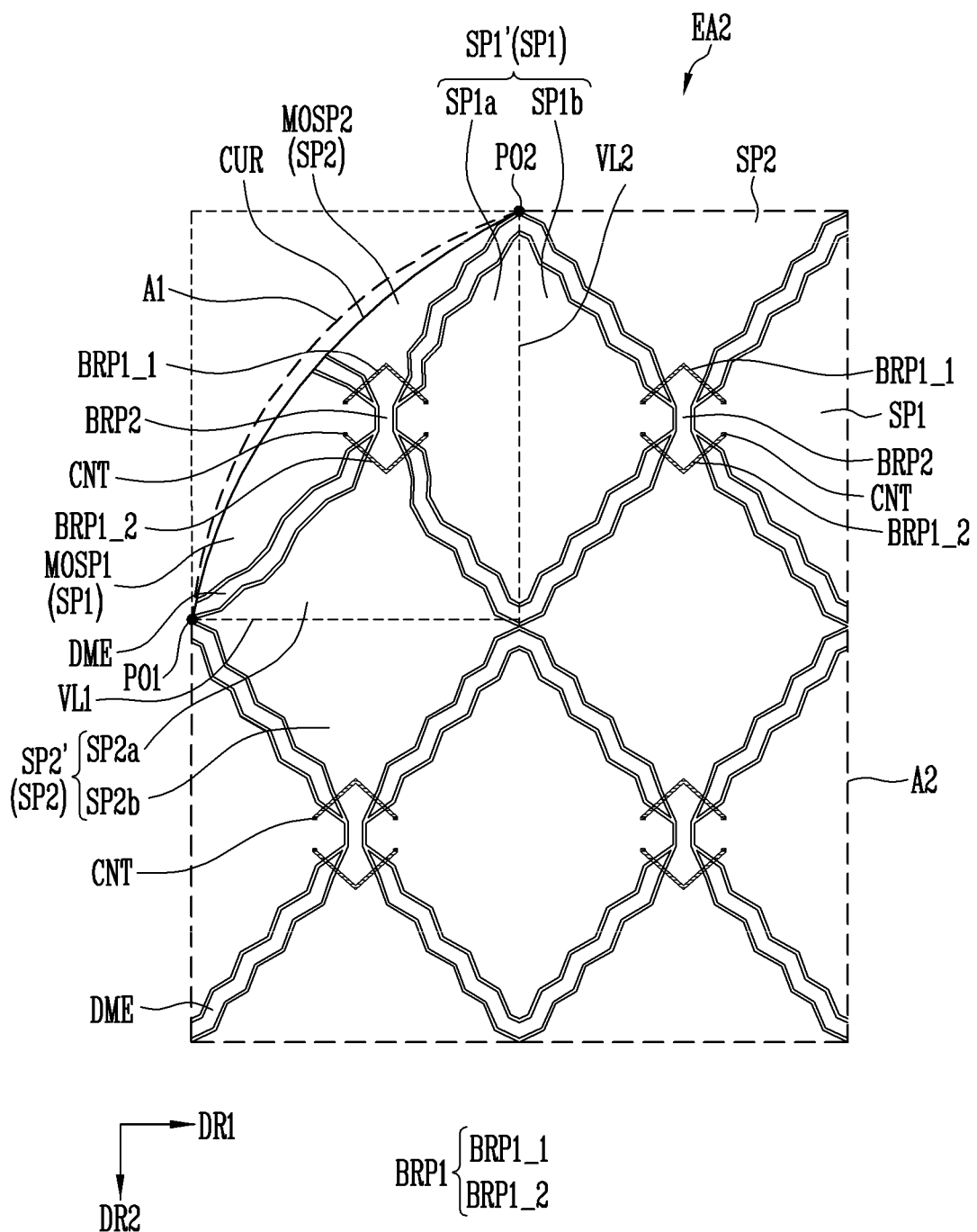
FIG. 12A is an enlarged schematic top plan view showing an example of a portion EA2 of FIG. 8.
Figure 12B:
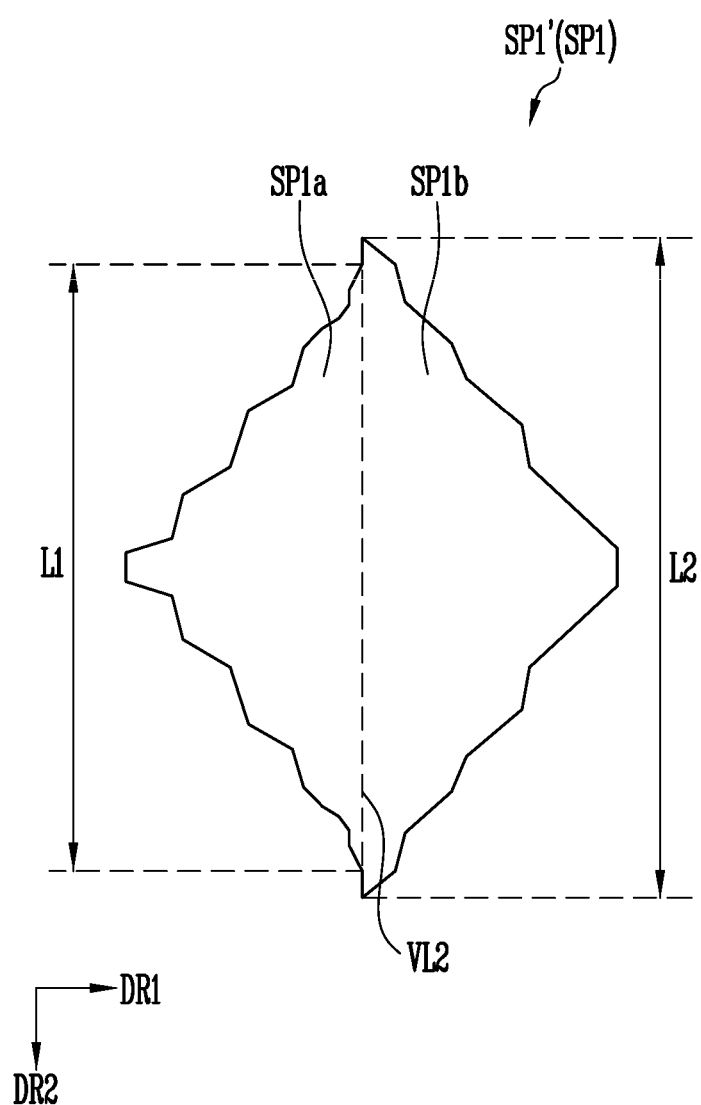
FIG. 12B is an enlarged schematic top plan view showing a first middle sensor pattern of FIG. 12A.
Figure 12C:
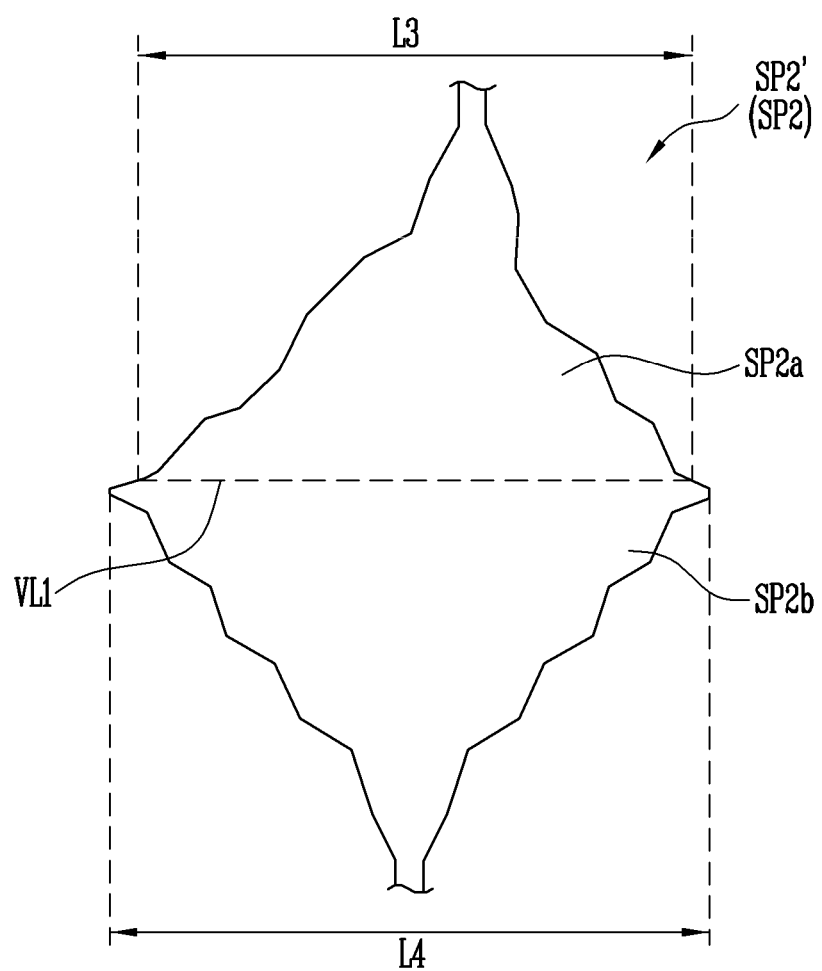
FIG. 12C is an enlarged schematic top plan view showing a second middle sensor pattern of FIG. 12A.
Figure 12D:
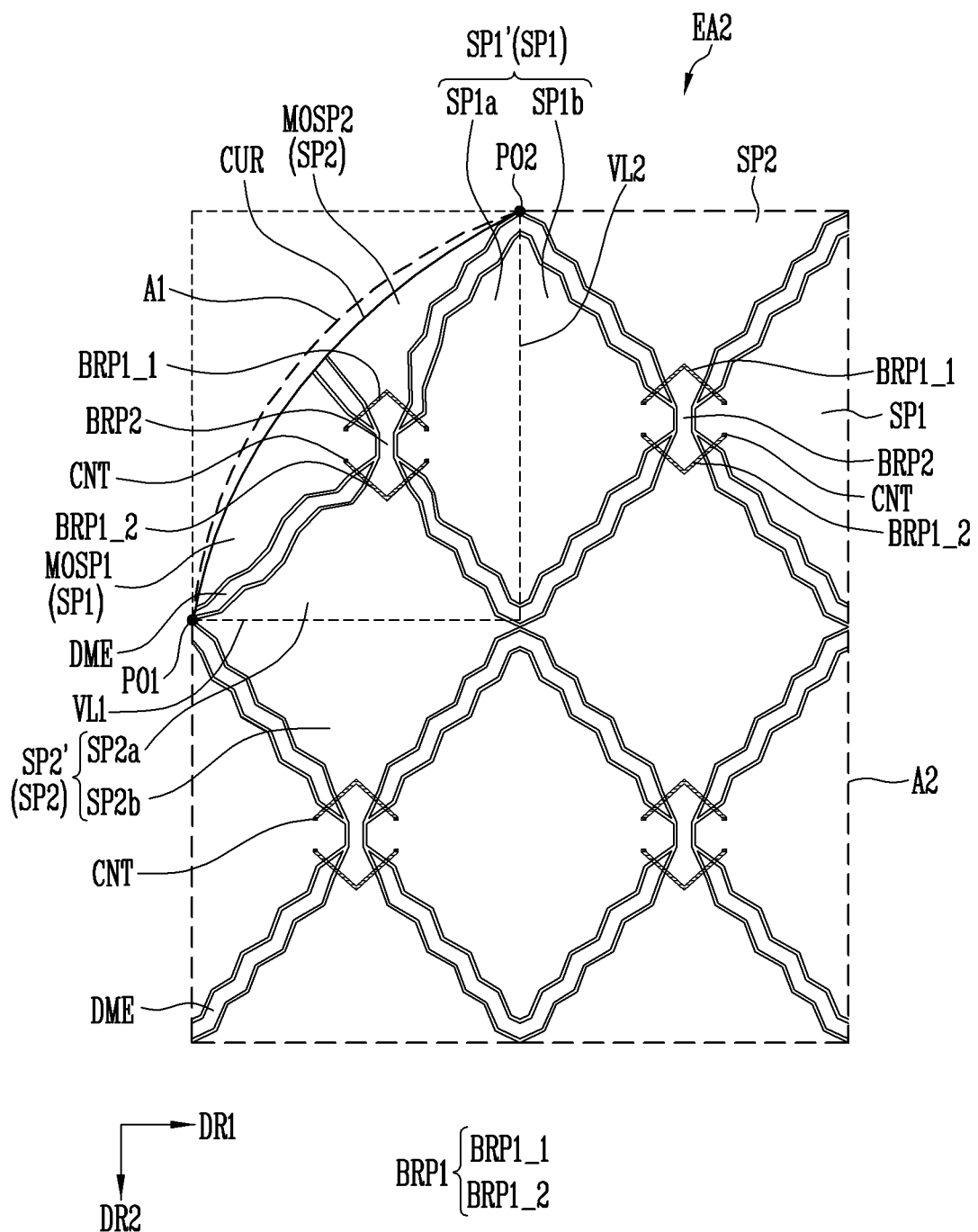
FIG. 12D is enlarged top plan view showing a portion EA2 of FIG. 8 according to another exemplary embodiment.

FIG. 12A is an enlarged schematic top plan view showing an example of a portion EA2 of FIG. 8, FIG. 12B is an enlarged top plan view schematically showing a first middle sensor pattern of FIG. 12A, FIG. 12C is an enlarged schematic top plan view showing a second middle sensor pattern of FIG. 12A, and FIG. 12D is enlarged top plan view showing a portion EA2 of FIG. 8 according to another exemplary embodiment.

Referring to FIGS. 1 to 12D, the sensing area SA of the touch sensor TS may include a first sensing area A1 including a curve CUR (i.e., non-square boundary) and a second sensing area A2 other than the first sensing area A1. A sensor electrode may be provided and/or formed in each of the first sensing area A1 and the second sensing area A2. The second sensing area A2 may partially surround a periphery of the first sensing area A1.

First and second outermost sensor patterns MOSP1 and MOSP2 and first and second bridge patterns BRP1 and BRP2 connected to the first and second outermost sensor patterns MOSP1 and MOSP2 may be disposed in the first sensing area A1.

In addition, the first sensor pattern SP1 and the second sensor pattern SP2 which are disposed to overlap a boundary between the first sensing area A1 and the second sensing area A2 may have a portion of the first sensor pattern SP1 and a portion of the second sensor pattern SP2 which are disposed in the first sensing area A1. In the following exemplary embodiment, for better understanding and ease of description, the first sensor pattern SP1 disposed over the first sensing area A1 and the second sensing area A2 is referred to as a first middle sensor pattern SP1', and the second sensor pattern SP2 disposed over the first sensing area A1 and the second sensing area A2 is referred to as a second middle sensor pattern SP2'.

The first middle sensor pattern SP1' may include a 1a-th and 1b-th sub-sensor patterns SP1$a$ and SP1$b$. The 1a-th sub-sensor pattern SP1$a$ may be disposed in the first sensing area A1, and the 1b-th sub-sensor pattern SP1$b$ may be disposed in the second sensing area A2.

A second virtual line VL2 is a line bisecting the first sensor pattern SP1 in the second sensing area A2 and passing through a second contact point PO2 of the curve CUR (i.e., non-square boundary) in the vertical direction, for example, in the second direction DR2. The second virtual line VL2 may be a boundary line disposed between the first sensing area A1 and the second sensing area A2. That is, the second line NL2 forming the first sensing area A1 may be a portion of the second virtual line VL2.

In an exemplary embodiment of the present invention, the 1a-th sub-sensor pattern SP1$a$ disposed on one side of the second virtual line VL2 and the 1b-th sub-sensor pattern SP1$b$ disposed the other side of the second virtual line VL2 may have a different size (or area). For example, the 1a-th sub-sensor pattern SP1$a$ disposed in the left side of the second virtual line VL2 in the first sensing area A1 may have a size (or area) smaller than the size (or area) of the 1b-th sub-sensor pattern SP1$b$ disposed in the right side of the second virtual line VL2 in the second sensing area A2. The 1a-th sub-sensor pattern SP1$a$ may have a longest length L1 (hereinafter, referred to as 'first length') along the second virtual line VL2 as shown in FIG. 12B. The 1b-th sub-sensor pattern SP1$b$ may have a longest length L2 (hereinafter, referred to as 'second length') along the second virtual line VL2. The first length L1 of the 1a-th sub-sensor pattern SP1$a$ may be less than 0.9 times the second length L2 of the 1b-th sub-sensor pattern SP1$b$.

The second middle sensor pattern SP2' may include a 2a-th sub-sensor pattern SP2$a$ and a 2b-th sub-sensor pattern SP2$b$. The 2a-th sub-sensor pattern SP2$a$ may be disposed in the first sensing area A1 and 2b-th sub-sensor pattern SP2$b$ may be disposed in the second sensing area A2.

A first virtual line VL1 is a line bisecting the second sensor pattern SP2 in the second sensing area A2 and passing through a first contact point PO1 of the curve CUR (i.e., non-square boundary) in the horizontal direction, for example, in the first direction DR1. The first virtual line VL1 may be a boundary line disposed between the first sensing area A1 and the second sensing area A2. That is, the first line NL1 forming the first sensing area A1 may be a portion of the first virtual line VL1.

In an exemplary embodiment of the present invention, the 2a-th sub-sensor pattern SP2$a$ disposed on one side of the first virtual line VL1 and the 2b-th sub-sensor pattern SP2$b$ disposed on the other side of the first virtual line VL1 may have a different size (or area). For example, the 2a-th sub-sensor pattern SP2$a$ disposed in an upper side of the first virtual line VL1 in the first sensing area A1 may have a size (or area) smaller than the size (or area) of the 2b-th sub-sensor pattern SP2$b$ disposed in a lower side of the first virtual line VL1 in the first sensing area A1. In particular, the 2a-th sub-sensor pattern SP2$a$ may have a longest length L3 (hereinafter, referred to as 'third length') along the first virtual line VL1 as shown in FIG. 12C. The 2b-th sub-sensor pattern SP2$b$ may have a longest length L4 (hereinafter, referred to as 'fourth length') along the first virtual line VL1. The third length L3 of the 2a-th sub-sensor pattern SP2$a$ may be less than 0.9 times the fourth length L4 of the 2b-th sub-sensor pattern SP2$b$.

When the 1a-th sub-sensor pattern SP1$a$ has the same size as the 1b-th sub-sensor pattern SP1$b$ and the 2a-th sub-sensor pattern SP2$a$ has the same size as the 2b-th sub-sensor pattern SP2$b$, the first and second bridge patterns BRP1 and BRP2 connected to each of the 1a-th and 2a-th sub-sensor patterns SP1$a$ and SP2$a$ may be cut off to have the curve CUR (i.e., non-square boundary) when cutting the base layer BSL to have the curve CUR (i.e., non-square boundary).

When the size of each of the 1a-th and 2a-th sub-sensor patterns SP1$a$ and SP2$a$ in the first sensing area A1 is formed relatively smaller than those in the second sensing area A2, the first and second bridge patterns connected to the 1a-th and 2a-th sub-sensor patterns SP1$a$ and SP2$a$ and disposed in the first sensing area A1 may be disposed away from the curve CUR (i.e., non-square boundary) in the first sensing area A1. That is, each of the first and second bridge patterns BRP1 and BRP2 in the first sensing area A1 may be disposed close to the second sensing area A2. Thus, the first and second bridge patterns BRP1 and BRP2 in the first sensing area A1 may be disposed in an inward direction than the first and second bridge patterns BRP1 and BRP2 that included in the same sensor column SEC and disposed in the second sensing area A2 as shown in FIG. 12A.

In an exemplary embodiment of the present inventive concept, the shape of the first outermost sensor pattern MOSP1 may be altered due to changes in shapes of the 1a-th sub-sensor pattern SP1$a$ and the 2a-th sub-sensor pattern SP2$a$, but the present inventive concept is not limited thereto. According to an exemplary embodiment, the first outermost sensor pattern MOSP1 may be designed to have a size and a shape different from the 1a-th sub-sensor pattern SP1$a$. In addition, the second outermost sensor pattern MOSP2 may be altered due to changes in shapes of the 1a-th sub-sensor pattern SP1$a$ and the 2a-th sub-sensor pattern SP2$a$, but the present inventive concept is not limited thereto. According to an exemplary embodiment, the second outermost sensor pattern MOSP2 may be designed to have a size and a shape different from the 2a-th sub-sensor pattern SP2$a$.

The first and second outermost sensor patterns MOSP1 and MOS2P and the 1a-th and 2a-th sub-sensor patterns SP1$a$ and SP2$a$ disposed in the first sensing area A1 may be designed to have a size and shape different from the sensor patterns SP disposed in the second sensing area A2. That is, the first and second outermost sensor patterns MOSP1 and MOS2P and the 1a-th and 2a-th sub-sensor patterns SP1a and SP2a disposed in the first sensing area A1 may be designed different from the sensor patterns SP disposed in the second sensing area A2.

In an exemplary embodiment of the present inventive concept, the dummy electrodes DME may be disposed between the first and second outermost sensor patterns MOSP1 and MOSP2 and between the 1a-th and 2a-th sub-sensor patterns SP1a and SP2a.

The dummy electrodes DME disposed in the first sensing area A1 may have the same width with the dummy electrodes DME disposed in the second sensing area A2, but the present inventive concept is not limited thereto. According to an exemplary embodiment, the dummy electrodes DME disposed in the first sensing area A1 may have a different shape from the dummy electrodes DME disposed in the second sensing area A2.

In addition, the dummy electrodes DME disposed to overlap a boundary between the first sensing area A1 and the second sensing area A2 may be connected without interruption to maintain the continuity. In particular, the dummy electrodes DME disposed between the 1a-th sub-sensor pattern SP1a and the 2a-th sub-sensor pattern SP2a in the first sensing area A1 may be connected uninterruptedly to the dummy electrodes DME disposed in the second sensing area A2 to maintain the continuity.

In an exemplary embodiment of the present inventive concept, the first outermost sensor pattern MOSP1 may be cut in a shape in which a pattern continuity with the first sensor pattern SP1 disposed in the same sensor row SER and adjacent in the first direction DR1, for example, the first middle sensor pattern SP1', is maintained. In addition, the second outermost sensor pattern MOSP2 may be cut in a shape in which a pattern continuity with the second sensor pattern SP2 disposed in the same sensor column SEC and adjacent in the second direction DR2, for example, the second middle sensor pattern SP2', is maintained.

As described above, the first and second bridge patterns BRP1 and BRP2 disposed in the first sensing area A1 may be arranged in a relatively inward direction, for example, closer to the second sensing area A2 than the first and second bridge patterns BRP1 and BRP2 disposed in the second sensing area A2 in the same sensor column SEC, thereby preventing a damage of the first and second bridge patterns BRP1 and BRP2 when the shape of the sensing area SA is changed. Therefore, the exemplary embodiment may ensure sufficient capacitance in the first sensing area A1 to improve sensing sensitivity in the first sensing area A1. According to an exemplary embodiment of the present inventive concept, as shown in FIG. 12D, the first and second bridge patterns BRP1 and BRP2 disposed in the first sensing area A1 may be arranged in a relatively inward direction, for example, closer to the second sensing area A2 than the first and second bridge patterns BRP1 and BRP2 disposed in the second sensing area A2 in the same sensor row SER, thereby preventing a damage of the first and second bridge patterns BRP1 and BRP2 when the shape of the sensing area SA is changed. Therefore, the exemplary embodiment may ensure sufficient capacitance in the first sensing area A1 to improve sensing sensitivity in the first sensing area A1.

Figure 13A:
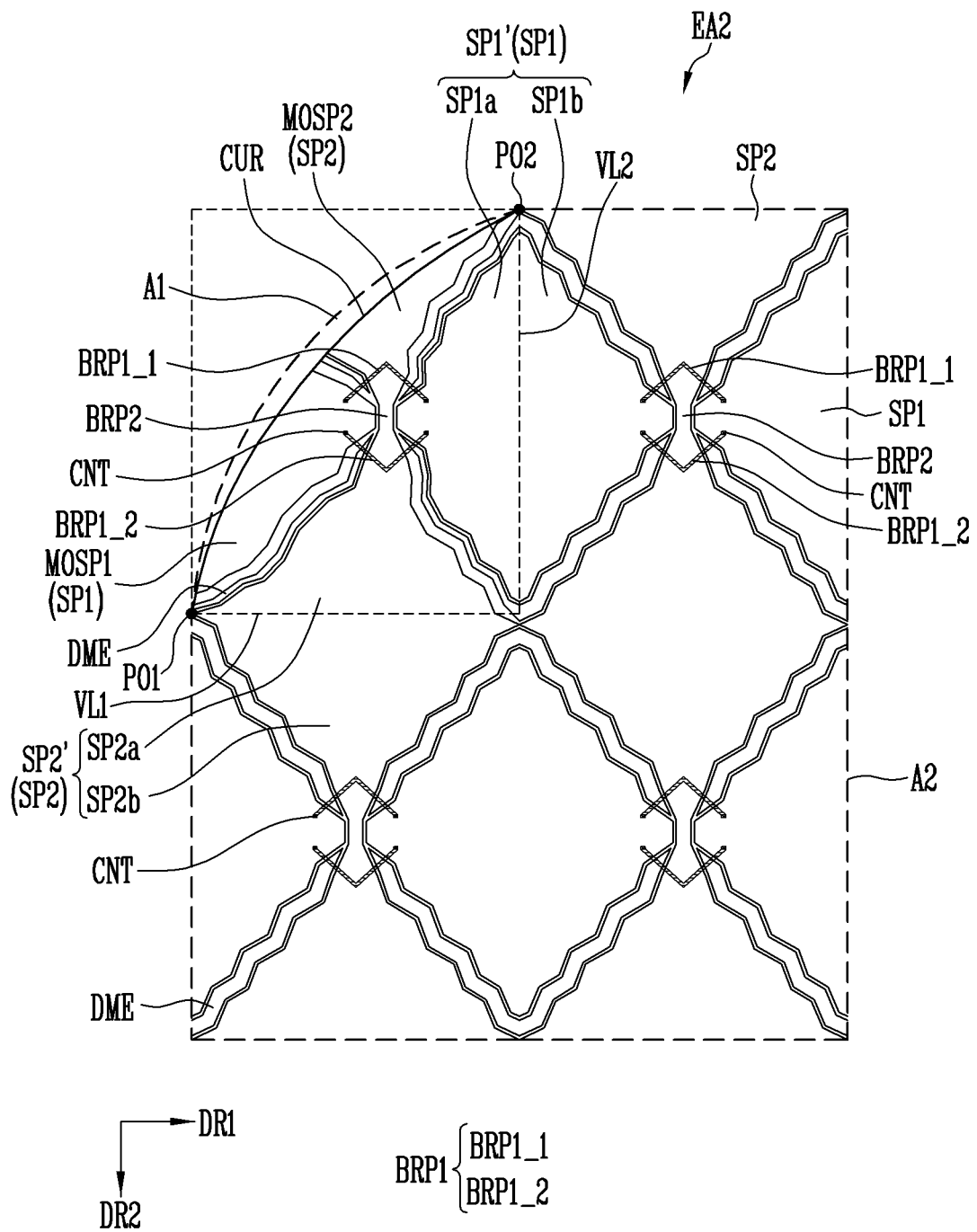
FIG. 13A to FIG. 13C are enlarged top plan views showing a portion EA2 of FIG. 8 according to various exemplary embodiments.
Figure 13B:
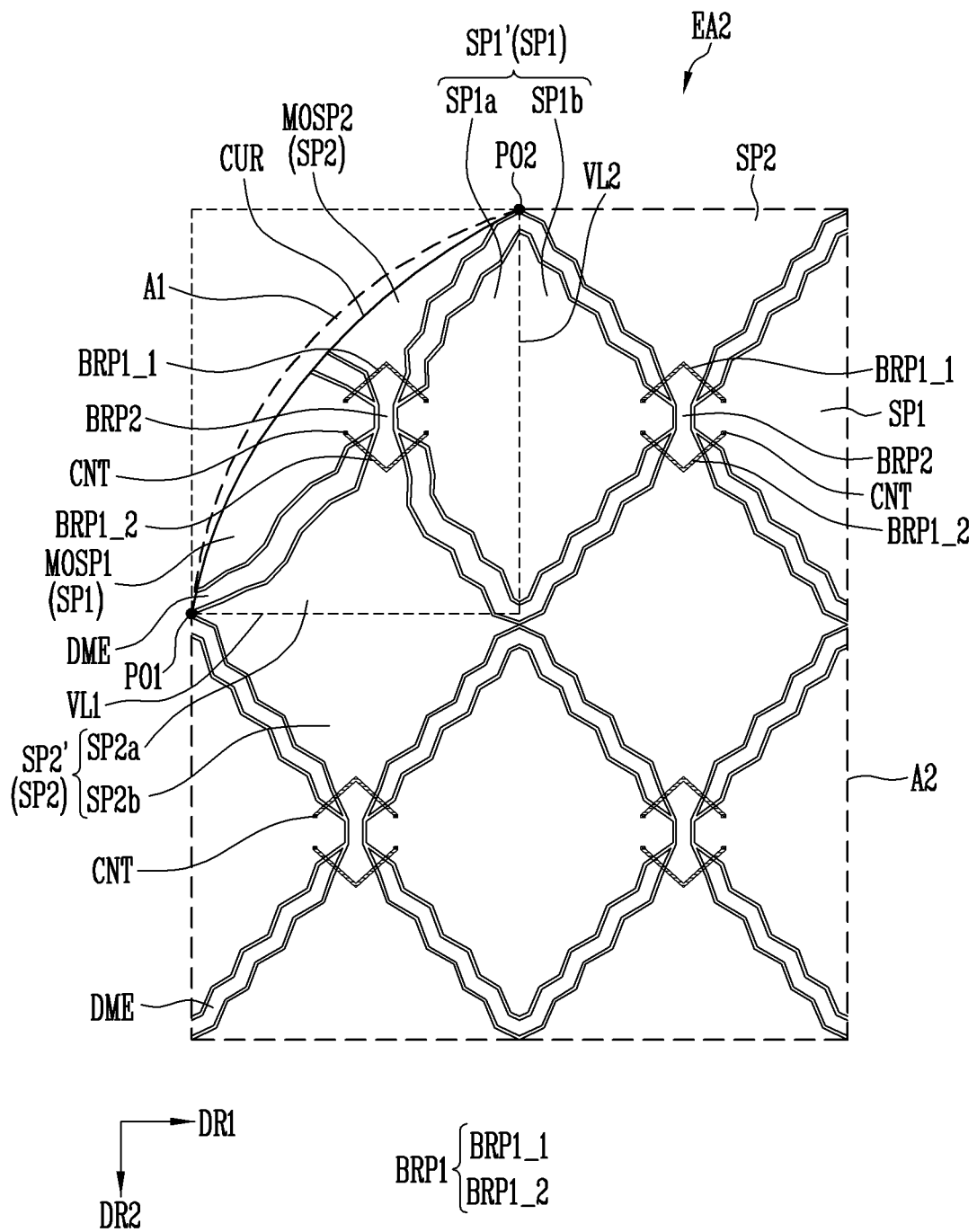
Figure 13C:
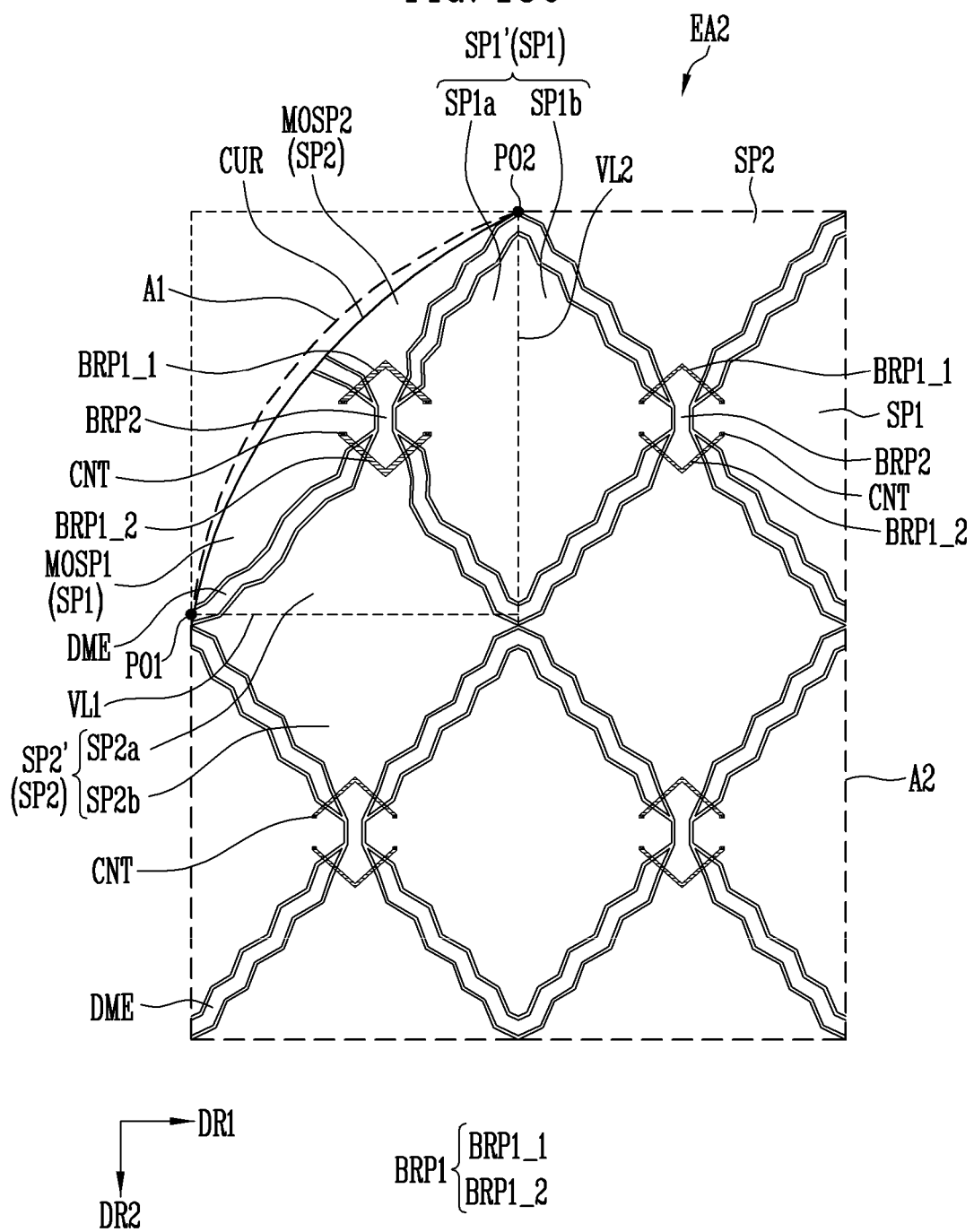

FIG. 13A to FIG. 13C are enlarged top plan views showing a portion EA2 of FIG. 8 according to various exemplary embodiments.

In the exemplary embodiment of FIGS. 13A to 13C, the description will be focused on points different from the exemplary embodiment described above in order to avoid a duplicate description. Parts not particularly described in the exemplary embodiment of FIGS. 13A to 13C refer to an exemplary embodiment described above, the same number represents the same constituent element, and the similar number represents a similar constituent element.

Referring to FIGS. 1 to 11B and FIGS. 13A to 13C, the touch sensor TS may include a base layer BSL including a sensing area SA and a non-sensing area NSA. The sensing area SA may include a first sensing area A1 including a curve CUR (i.e., non-square boundary) and a second sensing area A2 other than the first sensing area A1.

First and second outermost sensor patterns MOSP1 and MOSP2, a 1a-th sub-sensor pattern SP1a, a 2a-th sub-sensor pattern SP2a, first and second bridge patterns BRP1 and BRP2, dummy electrodes DME may be disposed in the first sensing area A1.

In an exemplary embodiment of the present inventive concept, the dummy electrodes DME of the first sensing area A1 may be connected to the dummy electrodes DME of the second sensing area A2 without interruption to maintain the continuity.

The dummy electrodes DME of the first sensing area A1 may be connected to the dummy electrodes DME of the second sensing area A2 and may be designed to be different from the dummy electrodes DME of the second sensing area A2. For example, the dummy electrodes DME in the first sensing area A1 may be designed to have a width less than a width of the dummy electrodes DME in the second sensing area A2 to have a size (or area) less than the dummy electrodes DME of the second sensing area A2 as shown in FIG. 13A. In this case, an area in which the dummy electrodes DME are disposed in the first sensing area A1, for example, a distance between the 1a-th sub-sensor pattern SP1a and the 2a-th sub-sensor pattern SP2a, and a distance between the first outermost sensor pattern MOSP1 and the second outermost sensor pattern MOSP2 may have the same distance as a distance between the first and second sensor patterns SP1 and SP2 in the second sensing area A2.

According to an exemplary embodiment, the distance between the 1a-th and 2a-th sub-sensor patterns SP1a and SP2a and the distance between the first and second outermost sensor patterns MOSP1 and MOSP2 may have a different distance from the distance between the first and second sensor patterns SP1 and SP2 in the second area A2. For example, as shown in FIG. 13B, when each of the 1a-th and 2a-th sub-sensor patterns SP1a and SP2a has a relatively much smaller size (or area) than each of the corresponding 1b-th and 2b-th sub-sensor patterns SP1b and SP2b, a distance between the 1a-th and 2a-th sub-sensor patterns SP1a and SP2a may have a distance larger than a distance between the first and second sensor patterns SP1 and SP2 in the second sensing area A2. Specifically, when the 1a-th sub-sensor pattern SP1a has a relatively much smaller size (or area) than the 1b-th sub-sensor pattern SP1b and the 2a-th sub-sensor pattern SP2a has a relatively much smaller size (or area) than the 2b-th sub-sensor pattern SP2b, a distance between the 1a-th and 2a-th sub-sensor patterns SP1a and SP2a may be increased by a reduced size (or area). In this case, the width of the dummy electrodes DME disposed in the area between the 1a-th and 2a-th sub-sensor patterns SP1a and SP2a may be increased to make the size of the dummy electrodes DME larger than the dummy electrodes DME in the second sensing area A2.

As described above, when a width of the dummy electrodes DME disposed in the first sensing area A1 is different from a width of the dummy electrodes DME disposed in the second sensing area A2, a fringing effect between the 1a-th and 2a-th sub-sensor patterns SP1a and SP2a and the first and second outermost sensor patterns MOSP1 and MOSP2 disposed in the first sensing area A1 may be efficiently controlled. Thus, the capacitance between the 1a-th and 2a-th sub-sensor patterns SP1a and SP2a in the first sensing area A1 and the first and second outermost sensor patterns MOSP1 and MOSP2 may be optimized to improve the sensing sensitivity in the first sensing area A1.

In the first sensing area A1, the first bridge pattern BRP1 may electrically connect the 1a-th sub-sensor pattern SP1a and the first outermost sensor pattern MOSP1, and the second bridge pattern BRP2 may electrically connect the 2a-th sub-sensor pattern SP2a and the second outermost sensor pattern MOSP2. The second bridge pattern BRP2 may be provided integrally with the second outermost sensor pattern MOSP2 and be regarded as a portion of the second outermost sensor pattern MOSP2.

The first bridge pattern BRP1 may include a 1-1-th bridge pattern BRP1_1 and a 1-2-th bridge pattern BRP1_2. Each of the 1-1-th bridge pattern BRP1_1 and the 1-2-th bridge pattern BRP1_2 may extend in the first direction DR1 to electrically connect the 1a-th sub-sensor pattern SP1a and the first outermost sensor pattern MOSP1 arranged in the same sensor row SER.

In an exemplary embodiment of the present inventive concept, the first bridge pattern BRP1 of the first sensing area A1 may have the same size (or the same area) as the first bridge pattern BRP1 disposed in the second sensing area A2, but the present inventive concept is not limited thereto. According to an exemplary embodiment, the first bridge pattern BRP1 in the first sensing area A1 may have a different size (or area) from the first bridge pattern BRP1 disposed in the second sensing area A2. For example, the first bridge pattern BRP1 in the first sensing area A1 may have a relatively larger width than the first bridge pattern BRP1 disposed in the second sensing area A2 as shown in FIG. 13C. In this case, the capacitance between the sensor patterns disposed in the first sensing area A1 may be different, thereby compensating for a reduction of the capacitance due to an area reduction of the first and second outermost sensor patterns MOSP1 and MOSP2 in the first sensing area A1. Thus, the sensing sensitivity in the first sensing area A1 may be improved.

Figure 14A:
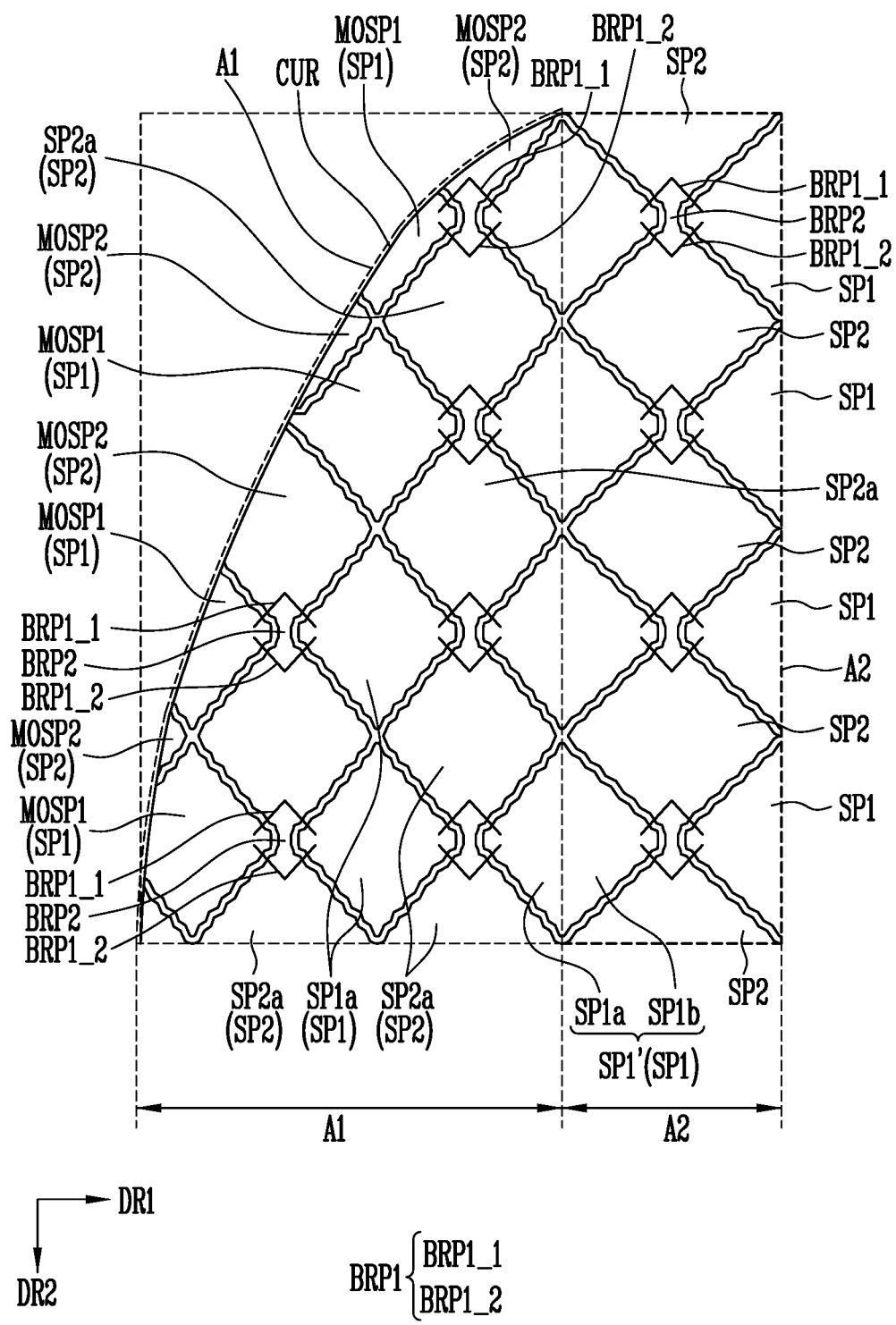
FIGS. 14A and 14B are enlarged top plan views showing a portion EA2 of FIG. 8 according to another exemplary embodiment.
Figure 14B:
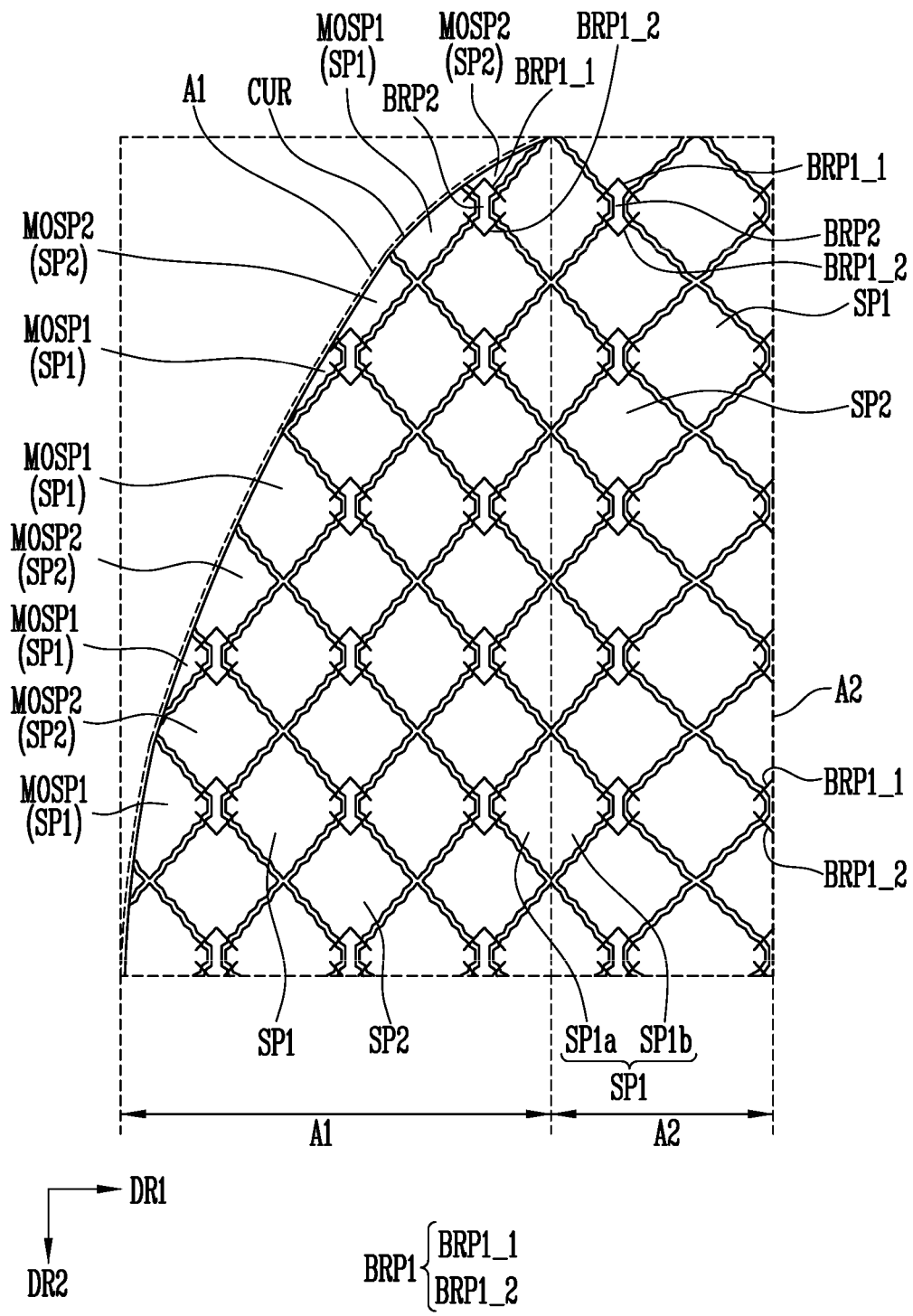

FIGS. 14A and 14B are enlarged top plan views showing a portion EA2 of FIG. 8 according to another exemplary embodiment.

For better understanding and ease of description, an illustration of the dummy electrode disposed in an area between sensing patterns in the sensing area is omitted in FIGS. 14A and 14B. In addition, each of FIGS. 14A and 14B schematically illustrates the first bridge patterns that electrically connect the first sensor patterns adjacent in the first direction for better understanding and ease of description.

In an exemplary embodiment of FIGS. 14A and 14B, the description will be focused on points different from the exemplary embodiment described above in order to avoid a duplicate description. Parts not particularly described in the exemplary embodiment of FIGS. 14A and 14B refer to an exemplary embodiment described above, the same number represents the same constituent element, and the similar number represents a similar constituent element.

First, referring to FIGS. 1 to 11B, and 14A, the sensing area SA of the touch sensor TS may include a first sensing area A1 and a second sensing area A2.

The first sensing area A1 may be an area including a curve CUR (i.e., non-square boundary) formed by altering the shape of the sensing area SA, and may be disposed at least one corner of the touch sensor TS.

According to a curvature of the curve CUR (i.e., non-square boundary), at least one outermost sensor patterns and at least one middle sensor patterns may be disposed in the first sensing area A1. For example, as the curvature of the curve CUR (i.e., non-square boundary) becomes larger, a plurality of first and second outermost sensor patterns MOSP1 and MOSP2 which has shapes different from the sensor patterns in the second sensing area A2 may be disposed in the first sensing area A1.

When a plurality of first and second outermost sensor patterns MOSP1 and MOSP2 are provided in the first sensing area A1, a plurality of first and second bridge patterns BRP1 and BRP2 connected to the first and second outermost sensor patterns MOSP1 and MOSP2 may be disposed in the first sensing area A1. A plurality of first and second bridge patterns BRP1 and BRP2 disposed in the first sensing area A1 may be cut off to have the curve CUR (i.e., non-square boundary) when cutting the base layer BSL to have the curve CUR (i.e., non-square boundary) or may be disposed very close to the curve CUR (i.e., non-square boundary). Therefore, a plurality of first and second bridge patterns BRP1 and BRP2 disposed in the first sensing area A1 may be damaged due to a static electricity inflow from the external or an external impact thereby the sensing sensitivity of the sensing electrodes in the first sensing area A1 is reduced.

The touch sensor TS according to an exemplary embodiment of the present inventive concept may be formed such that the size (or area) of the 1a-th sub-sensor patterns SP1a that are disposed in the first sensing area A1 and are connected to the first bridge patterns BRP1 and the 2a-th sub-sensor patterns SP2a that are disposed in the first sensing area A1 and are connected to the second bridge patterns BRP2 is relatively small, thereby making the first and second bridge patterns BRP1 and BRP2 be directed in an inward direction (e.g., a direction close to the second sensing area A2). That is, in the touch sensor TS according to an exemplary embodiment of the present inventive concept, a plurality of first and second bridge patterns BRP1 and BRP2 disposed in the first sensing area A1 are disposed as far as possible from the curve CUR (i.e., non-square boundary). Thus, a sufficient capacitance may be secured in the first sensing area A1 to improve the sensing sensitivity in the first sensing area A1.

Next, referring to FIGS. 1 to 11B and 14B, the sensing area SA of the touch sensor TS may include a first sensing area A1 and a second sensing area A2. The first sensing area A1 may be an area including the curve CUR formed by altering the shape of the sensing area SA, and may be disposed at least one corner of the touch sensor TS.

A plurality of first and second outermost sensor patterns MOSP1 and MOSP2 having shapes different from the first sensor patterns SP1 and the second sensor patterns SP2 may be disposed in the first sensing area A1. In addition, the first and second sensor patterns SP1 and SP2 with a smaller size (or area) than the first and second sensor patterns SP1 and SP2 in the second sensing area A2 may be disposed in the first sensing area A1. That is, the first and second sensor patterns SP1 and SP2 disposed in the first sensing area A1 may be designed to have a relatively smaller size than the first and second sensor patterns SP1 and SP2 disposed in the second sensing area A2. In this case, a large number of first and second sensor patterns SP1 and SP2 may be disposed in the first sensing area A1.

When the size (or area) of each of the first and second sensor patterns SP1 and SP2 disposed in the first sensing area A1 is relatively small, the first and second sensor patterns SP1 and SP2 may not be disposed over the first sensing area A1 and the second sensing area A2, but the present inventive concept is not limited thereto. According to an exemplary embodiment, some of the first and second sensor patterns SP1 and SP2 disposed in the first sensing area A1, for example, the first sensor patterns SP1 may be disposed to overlap a boundary between the first sensing area A1 and the second sensing area A2.

The first sensor patterns SP1 disposed to overlap a boundary between the first sensing area A1 and the second sensing area A2 may be the middle sensor pattern, and the middle sensor pattern may include the 1a-th sub-sensor pattern SP1a disposed in the first sensing area A1 and the 1b-th sub-sensor pattern SP1b disposed in the second sensing area A2. At this time, the 1a-th sub-sensor pattern SP1a and the 1b-th sub-sensor pattern SP1b may have the same size with each other. Accordingly, the 1a-th sub-sensor pattern SP1a and the 1b-th sub-sensor pattern SP1b may have a symmetric structure with respect to the second virtual line VL2.

When the size (or area) of the sensor patterns SP disposed in the first sensing area A1 is relatively smaller than the sensor patterns SP disposed in the second sensing area A2, the number of the sensor patterns SP capable of being disposed in the first sensing area A1 may be increased. Therefore, a sufficient capacitance may be secured in the first sensing area A1 to improve the sensing sensitivity in the first sensing area A1.

Figure 15:
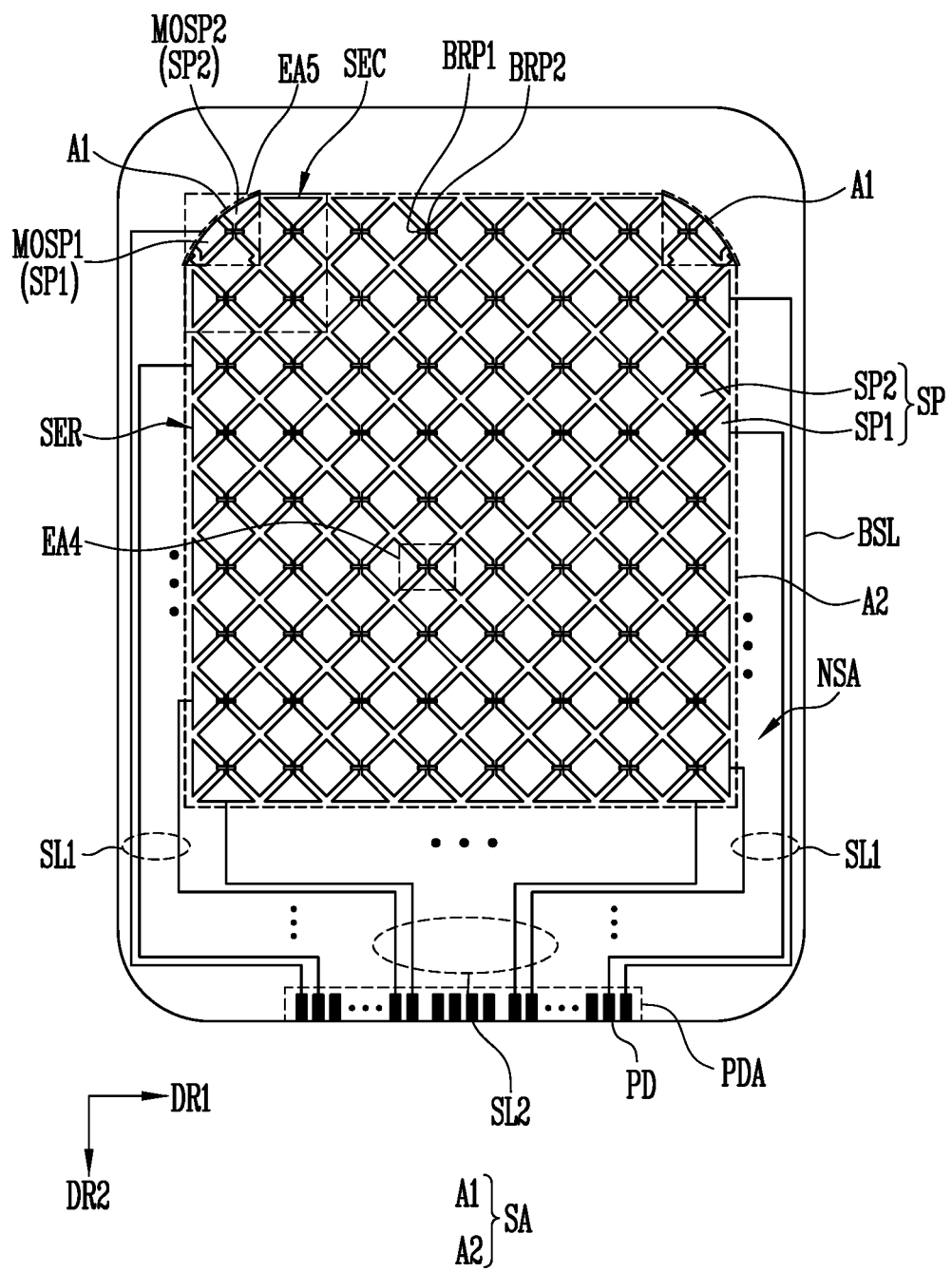
FIG. 15 is a schematic top plan view showing a touch sensor in shown in FIG. 7 according to another exemplary embodiment.
Figure 16:
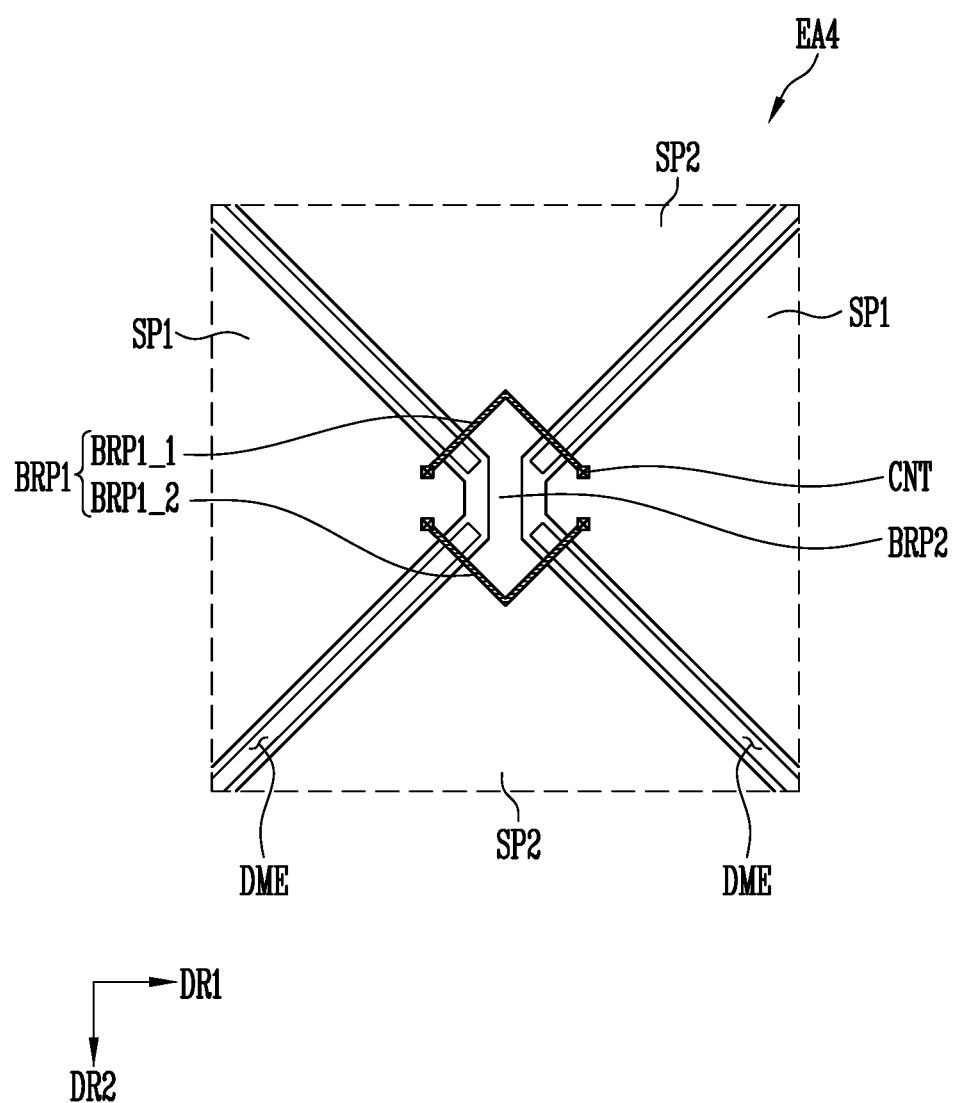
FIG. 16 is an enlarged schematic top plan view showing an example of a portion EA4 of FIG. 15.
Figure 17:
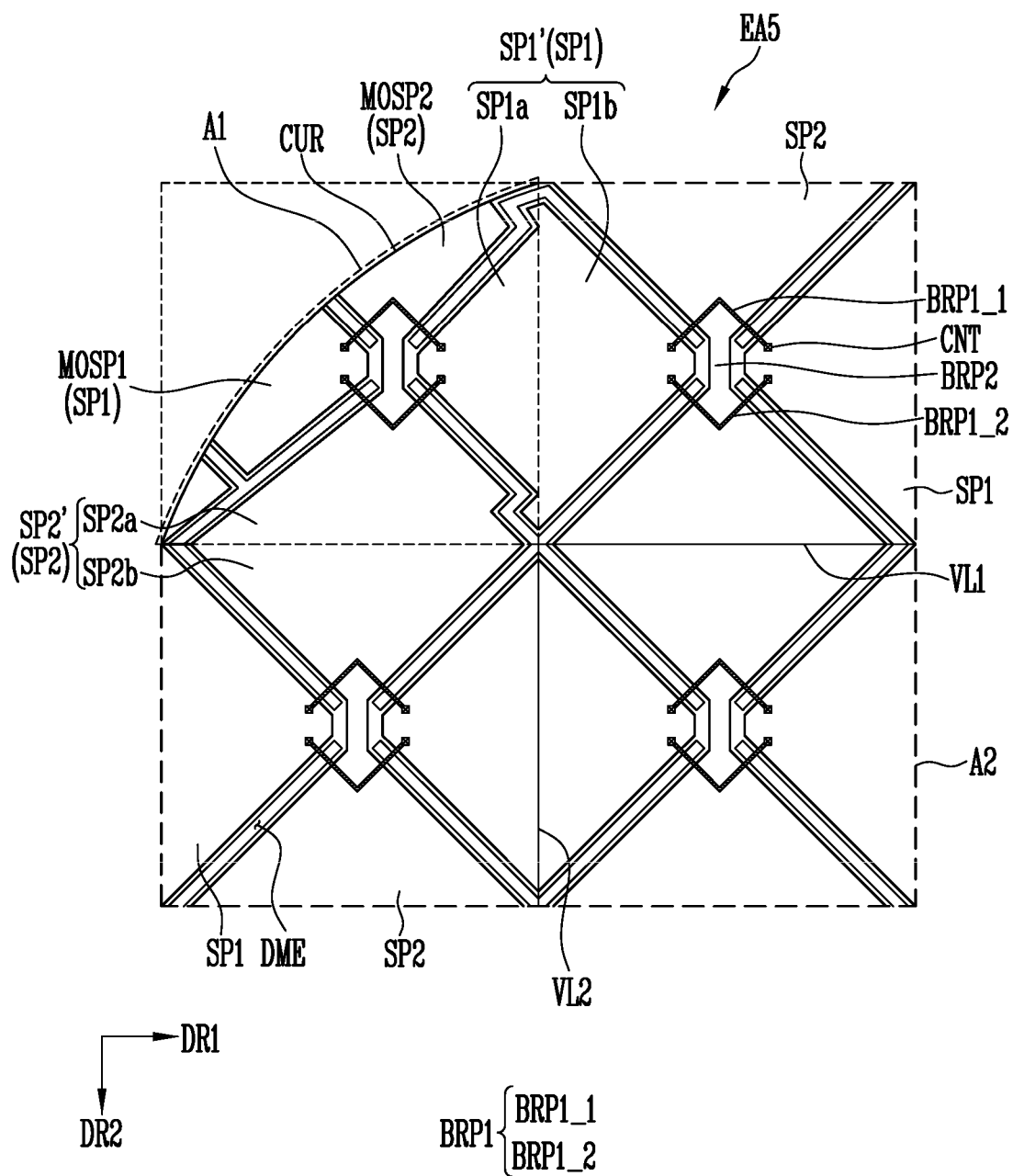
FIG. 17 is an enlarged schematic top plan view showing an example of a portion EA5 of FIG. 15.

FIG. 15 is a schematic top plan view showing a touch sensor in shown in FIG. 7 according to another exemplary embodiment, FIG. 16 is an enlarged schematic top plan view showing an example of a portion EA4 of FIG. 15, and FIG. 17 is a schematic enlarged top plan view showing an example of a portion EA5 of FIG. 15.

The touch sensor shown in FIGS. 15 to 17 may have substantially the same or similar configuration as the touch sensor shown in FIGS. 8 to 12A except that the sensor patterns have a rhombic shape.

Thus, in the exemplary embodiment of FIGS. 15 to 17, the description will be focused on points different from the exemplary embodiment described above in order to avoid a duplicate description. Parts not particularly described in the present exemplary embodiment refer to the exemplary embodiment described above, the same number represents the same constituent element, and the similar number represents a similar constituent element.

Referring to FIGS. 1 to 7 and 15 to 17, the touch sensor TS may include a base layer BSL including a sensing area SA and a non-sensing area NSA.

The sensing area SA may be an area where the sensor electrode is disposed to sense the touch input, and the non-sensing area NSA may be an area surrounding at least one area of the sensing area SA.

The sensor electrode may include a plurality of first sensor patterns SP1, a plurality of second sensor patterns SP2, a plurality of first bridge patterns BRP1, a plurality of second bridge patterns BRP2, and a plurality of dummy electrodes DME. The first and second sensor patterns SP1 and SP2 are shown as rhombus shapes, but the shapes of the first and second sensor patterns SP1 and SP2 are not limited thereto. According to the exemplary embodiment, the first and second sensor patterns SP1 and SP2 may have another polygonal shape.

In an exemplary embodiment of the present inventive concept, the sensing area SA may include a first sensing area A1 including a curve CUR (i.e., non-square boundary) with a predetermined curvature and a second sensing area A2 other than the first sensing area A1.

The first and second outermost sensor patterns MOSP1 and MOSP2, and the first and second bridge patterns BRP1 and BRP2 connected to the first and second outermost sensor patterns MOSP1 and MOSP2 may be disposed in the first sensing area A1. The first and second outermost sensor patterns MOSP1 and MOSP2 may be cut off to have the curve CUR (i.e., non-square boundary) when cutting the base layer BSL to have the curve CUR (i.e., non-square boundary).

In an exemplary embodiment of the present inventive concept, first and second middle sensor patterns SP1' and SP2' disposed to overlap a boundary between the first sensing area A1 and the second sensing area A2 may be disposed in a boundary area between the first sensing area A1 and the second sensing area A2.

The first middle sensor pattern SP1' may include a 1a-th sub-sensor pattern SP1a disposed in the first sensing area A1 and a 1b-th sub-sensor pattern SP1b disposed in the second sensing area A2. The second middle sensor pattern SP2' may include a 2a-th sub-sensor pattern SP2a disposed in the first sensing area A1 and a 2b-th sub-sensor pattern SP2b disposed in the second sensing area A2.

The 1a-th sub-sensor pattern SP1a and the 1b-th sub-sensor pattern SP1b may have the same shape or a substantially similar shape.

In addition, the 1a-th sub-sensor pattern SP1a and the 1b-th sub-sensor pattern SP1b may have different sizes (or areas). For example, the 1a-th sub-sensor pattern SP1a disposed on the left side of the second virtual line VL2 in the first sensing area A1 may have a size (or an area) less than the 1b-th sub-sensor pattern SP1b disposed on the right side of the second virtual line VL2 in the second sensing area A2. Accordingly, the 1a-th sub-sensor pattern SP1a and the 1b-th sub-sensor pattern SP1b may have an asymmetric structure with respect to the second virtual line VL2.

In an exemplary embodiment of the present inventive concept, by reducing a length of sides forming a boundary of the 1a-th sub-sensor patterns SP1a or by altering an angle formed by the second virtual line VL2 and sides forming a boundary of the 1a-th sub-sensor patterns SP1a, the 1a-th sub-sensor pattern SP1a may have an asymmetric structure with the 1b-th sub-sensor pattern SP1b with respect to the second virtual line VL2. However, the present inventive concept is not limited thereto. According to an exemplary embodiment, the 1a-th sub-sensor pattern SP1a and the 1b-th sub-sensor pattern SP1b may have a symmetric structure with respect to the second virtual line VL2.

The 2a-th sub-sensor pattern SP2a and the 2b-th sub-sensor pattern SP2b may have the same shape or a substantially similar shape.

In addition, the 2a-th sub-sensor pattern SP2a and the 2b-th sub-sensor pattern SP2b may have different sizes (or areas). For example, the 2a-th sub-sensor pattern SP2a disposed on an upper side of the first virtual line VL1 in the first sensing area A1 may have a size (or an area) less than the 2b-th sub-sensor pattern SP2b disposed on a lower side of the first virtual line VL1 in the second sensing area A2. Accordingly, the 2a-th sub-sensor pattern SP2a and the 2b-th sub-sensor pattern SP2b may have an asymmetric structure with respect to the first virtual line VL1. However, the present inventive concept is not limited thereto. According to the exemplary embodiment, the 2a-th sub-sensor pattern SP2a and the 2b-th sub-sensor pattern SP2b may have a symmetrical structure with respect to the first virtual line VL1.

When the size (or the area) of each of the 1a-th and 2a-th sub-sensor patterns SP1a and SP2a is formed relatively small, the first bridge pattern BRP1 connecting the 1a-th sub-sensor pattern SP1a and the first outermost sensor pattern MOSP1 and the second bridge pattern BRP2 connecting the 2a-th sub-sensor pattern SP2a and the second outermost sensor pattern MOSP2 may be disposed away from the curve CUR (i.e., non-square boundary) in the first sensing area A1. That is, the first and second bridge patterns BRP1 and BRP2 disposed in the first sensing area A1 may be disposed close to the second sensing area A2. Accordingly, the first and second bridge patterns BRP1 and BRP2 in the first sensing area A1 may be disposed in a relatively inward direction than the first and second bridge patterns BRP1 and BRP2 that are included in the same sensor column SEC in the second sensing area A2 as shown in FIG. 17.

As described above, the first and second bridge patterns BRP1 and BRP2 disposed in the first sensing area A1 may be arranged in the relatively inward direction, for example, closer to the second sensing area A2, thereby preventing a damage of the first and second bridge patterns BRP1 and BRP2 even when the shape of the sensing area SA is changed. Therefore, the exemplary embodiment may ensure sufficient capacitance in the first sensing area A1 to improve sensing sensitivity in the first sensing area A1.

The dummy electrodes DME disposed in the first sensing area A1 and the dummy electrodes DME disposed in the second sensing area A2 may have the same shape. In addition, the dummy electrode DME disposed to overlap a boundary between the first sensing area A1 and the second sensing area A2 may maintain the continuity by uninterruptedly connecting a portion extending to the first sensing area A1 and a portion extending to the second sensing area A2.

Figure 18A:
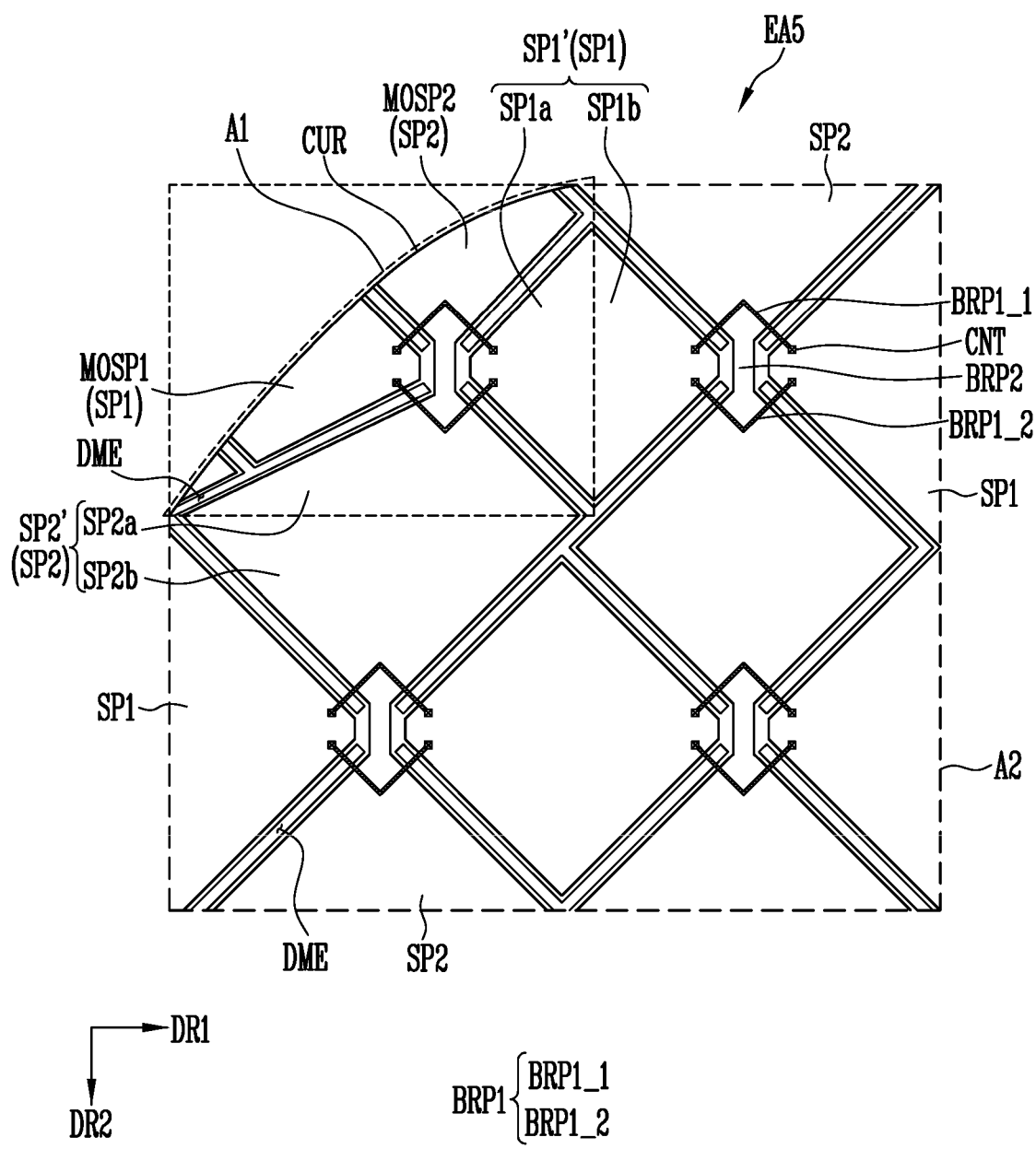
FIGS. 18A and 18B are enlarged top plan view showing a portion EA5 of FIG. 15 according to another exemplary embodiment.
Figure 18B:
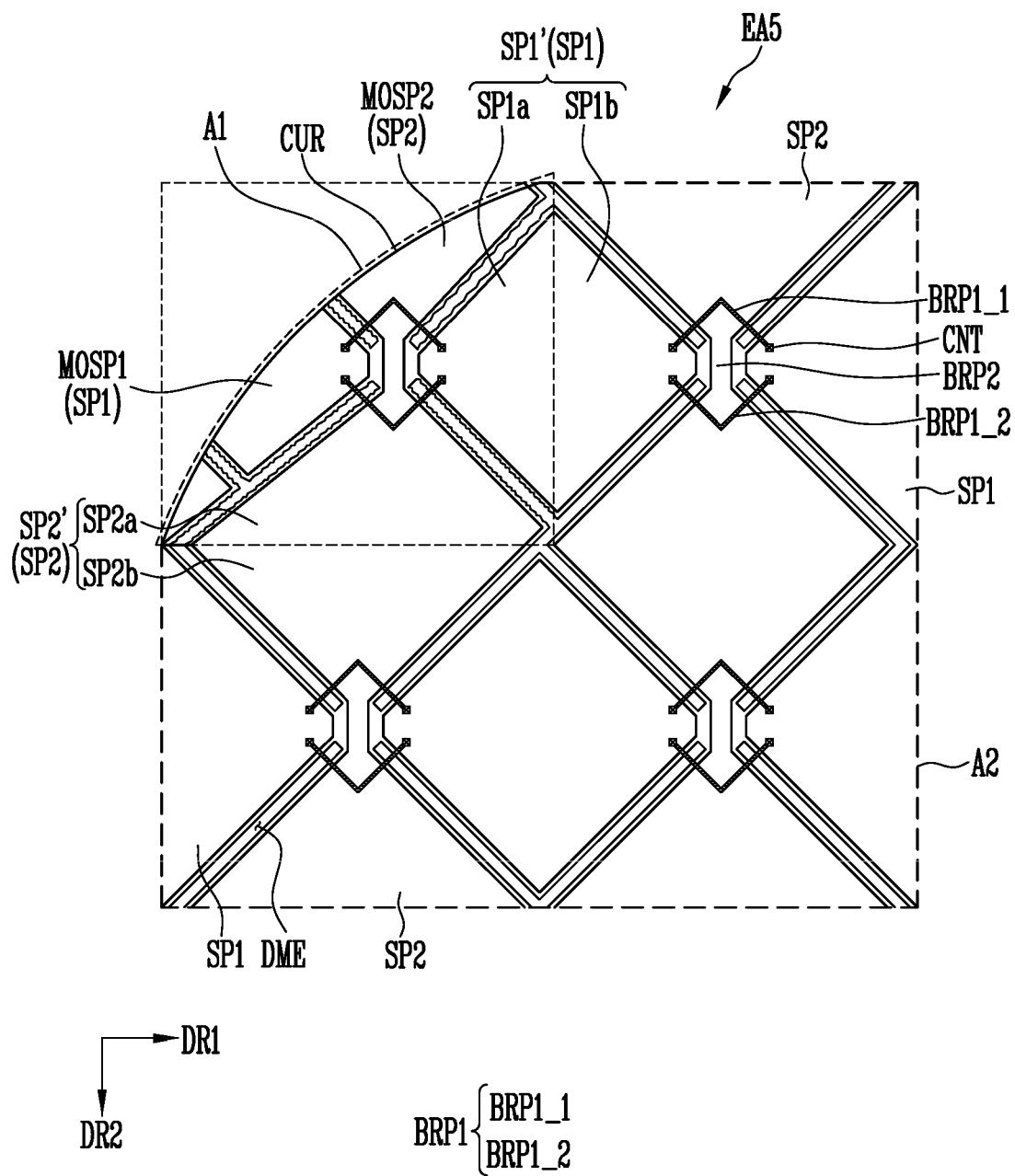

FIGS. 18A and 18B are enlarged top plan view showing a portion EA5 of FIG. 15 according to another exemplary embodiment.

In the exemplary embodiment of FIGS. 18A and 18B, the description will be focused on points different from the exemplary embodiment described above in order to avoid a duplicate description. Parts not particularly described in the exemplary embodiment of FIGS. 18A and 18B refer to an exemplary embodiment described above, the same number represents the same constituent element, and the similar number represents a similar constituent element.

Referring to FIGS. 1 to 7, 15, 18A, and 18B, the touch sensor TS may include a base layer BSL including a sensing area SA and a non-sensing area NSA. The sensing area SA may include a first sensing area A1 including a curve CUR (i.e., non-square boundary) and a second sensing area A2 other than the first sensing area A1.

In an exemplary embodiment of the present inventive concept, the first and second middle sensor patterns SP1' and SP2' disposed to overlap a boundary between the first sensing area A1 and the second sensing area A2 may have a size (or an area) different from the first and second sensor patterns SP1 and SP2 disposed in the second sensing area A2. For example, the first middle sensor pattern SP1' may have a relatively smaller size (or a relatively small area) than the first sensor pattern SP1 disposed in the second sensing area A2, and the second middle sensor pattern SP2' may have a relatively smaller size (or a relatively small area) than the second sensor patterns SP2 disposed in the second sensing area A2.

The first middle sensor pattern SP1' may include a 1a-th sub-sensor pattern SP1a disposed in the first sensing area A1 and a 1b-th sub-sensor pattern SP1b disposed in the second sensing area A2. The 1a-th sub-sensor pattern SP1a and 1b-th sub-sensor pattern SP1b may have a symmetrical structure with respect to a boundary line (i.e., boundary line between the first sensing area A1 and the second sensing area A2) that crosses a center (or middle) of the first middle sensor pattern SP1' in the second direction DR2 as shown in FIGS. 18A and 18B. Accordingly, the 1a-th sub-sensor pattern SP1a and the 1b-th sub-sensor pattern SP1b may have the same size (or area). Because the 1a-th and 1b-th sub-sensor patterns SP1a and SP1b have the same size (or the same area) but the first middle sensor pattern SP1' has a relatively smaller size (or a relatively smaller area) than the first sensor pattern SP1 disposed in the second sensing area A2, the first bridge pattern BRP1 connected to the 1a-th sub-sensor pattern SP1a may be disposed away from the curve CUR (i.e., non-square boundary).

The dummy electrodes DME may be disposed between the first outermost sensor pattern MOSP1 and the second outermost sensor pattern MOSP2 and between the 1a-th sub-sensor pattern SP1a and the 2a-th sub-sensor pattern SP2a in the first sensing area A1. In an exemplary embodiment of the present inventive concept, the dummy electrode DME disposed to overlap a boundary between the first sensing area A1 and the second sensing area A2 may maintain the continuity by uninterruptedly connecting a portion extending to the first sensing area A1 and a portion extending to the second sensing area A2.

The dummy electrodes DME disposed in the first sensing area A1 may have a bar shape extending parallel to each of a boundary of the 1a-th sub-sensor pattern SP1a and a boundary of the 2a-th sub-sensor pattern SP2a. The dummy electrodes DME disposed in the first sensing area A1 may have the same shape as the dummy electrodes DME disposed in the second sensing area A2 as shown in FIG. 18A, but the present inventive concept is not limited thereto. According to an exemplary embodiment, the dummy electrodes DME disposed in the first sensing area A1 may have a zigzag shape as shown in FIG. 18B. When the dummy electrodes DME disposed in the first sensing area A1 have a zigzag shape, a boundary area between the 1a-th sub-sensor pattern SP1a and the 2a-th sub-sensor pattern SP2a disposed in the first sensing area A1 and a boundary area between the first outermost sensor pattern MOSP1 and the second outermost sensor pattern MOSP2 may not be recognized.

It is a matter of course that the shape of the dummy electrodes DME disposed in the first sensing area A1 may be not limited to the exemplary embodiments described above and may be altered into various shapes.

While the present inventive concept has been shown and described with reference to certain exemplary embodiments thereof, it will be understood by those skilled in the art that various changes in forms and details may be made therein without departing from the spirit and scope of the present inventive concept as defined by the appended claims and their equivalents.

Accordingly, the technical scope of the present disclosure may be determined by the technical scope of the accompanying claims.

What is claimed is:

1. A touch sensor comprising:
a base layer including a sensing area and a non-sensing area; and
a sensor electrode disposed in the sensing area and including sensor patterns,
wherein the sensing area includes a first area including a corner area with a predetermined shape and a second area not including the corner area,
wherein, among the sensor patterns, one disposed in the first area and another one disposed in the second area have different sizes from each other,
wherein the sensor patterns include:
first sensor patterns and first bridge patterns connecting the first sensor patterns, and
second sensor patterns and second bridge patterns connecting the second sensor patterns,
wherein the second bridge patterns include a second corner bridge pattern disposed in the first area and second non-corner bridge patterns disposed in the second area, and
wherein the second corner bridge pattern in a first column is not disposed on a line on which the second non-corner bridge patterns in the first column are disposed.

2. The touch sensor of claim 1, wherein
the sensor patterns disposed in the first area have a less size than the sensor patterns disposed in the second area.

3. The touch sensor of claim 2, wherein
the sensor patterns include at least one middle sensor pattern disposed to overlap a boundary between the first area and the second area.

4. The touch sensor of claim 3, wherein
the middle sensor pattern has a different size from each of the sensor patterns disposed in the second area.

5. The touch sensor of claim 4, wherein
the middle sensor pattern includes a first sub-sensor pattern disposed in the first area and a second sub-sensor pattern disposed in the second area.

6. The touch sensor of claim 5, wherein
the first sub-sensor pattern and the second sub-sensor pattern have a symmetrical structure with respect to a boundary line between the first area and the second area.

7. The touch sensor of claim 6, wherein
the middle sensor pattern has a less size than the sensor patterns disposed in the second area.

8. The touch sensor of claim 5, wherein
the first sub-sensor pattern and the second sub-sensor pattern have different sizes each other.

9. The touch sensor of claim 8, wherein
the first sub-sensor pattern has a less size than the second sub-sensor pattern.

10. The touch sensor of claim 9, wherein
the first sub-sensor pattern and the second sub-sensor pattern have an asymmetric structure with respect to a virtual line extending in one direction.

11. The touch sensor of claim 8, wherein the sensor patterns include dummy electrodes disposed between the first and second sensor patterns.

12. The touch sensor of claim 11, wherein
dummy electrodes disposed to overlap a boundary between the first area and the second area among the dummy electrodes are connected each other to maintain a continuity.

13. The touch sensor of claim 12, wherein
dummy electrodes disposed in the first area and dummy electrodes disposed in the second area among the dummy electrodes have a same shape.

14. The touch sensor of claim 12, wherein
dummy electrodes disposed in the first area and dummy electrodes disposed in the second area among the dummy electrodes have a different shape.

15. The touch sensor of claim 14, wherein
the dummy electrodes disposed in the first area have a greater width than or a less width than the dummy electrodes disposed in the second area.

16. The touch sensor of claim 11, wherein
first and second bridge patterns disposed in the first area are not disposed on a line connecting the first and second bridge patterns disposed in the second area in a same column.

17. The touch sensor of claim 16, wherein
the first and second bridge patterns disposed in the first area are disposed close to the boundary disposed between the first area and the second area than the first and second bridge patterns disposed in the second area.

18. The touch sensor of claim 1, wherein the first bridge patterns include a first corner bridge pattern in the first area and first non-corner bridge patterns in the second area, and
wherein the first corner bridge pattern in the first column is not disposed on a line on which the first non-corner bridge patterns in the first column are disposed.

19. A display device comprising:
a display panel for displaying an image; and
a touch sensor disposed on the display panel,
wherein the touch sensor includes
a base layer including a sensing area and a non-sensing area; and
a sensing electrode disposed in the sensing area and including sensor patterns,
wherein the sensing area includes a first area including a corner area with a predetermined shape and a second area not including the corner area,
wherein, among the sensor patterns, one disposed in the first area and another one disposed in the second area have different sizes from each other,
wherein the sensor patterns include:
first sensor patterns and first bridge patterns connecting the first sensor patterns, and
second sensor patterns and second bridge patterns connecting the second sensor patterns,
wherein the second bridge patterns include a second corner bridge pattern disposed in the first area and second non-corner bridge patterns disposed in the second area; and
wherein the second corner bridge pattern in a first column is not disposed on a line on which the second non-corner bridge patterns in the first column are disposed.

20. The display device of claim 19, wherein
the sensor patterns disposed in the first area have a less size than the sensor patterns disposed in the second area.

21. The display device of claim 20, wherein
the sensor patterns include at least one middle sensor pattern disposed to overlap a boundary between the first area and the second area, and
the middle sensor pattern has a different size from each of the sensor patterns disposed in the second area.

22. The display device of claim 21, wherein the middle sensor pattern includes a first sub-sensor pattern disposed in the first area and a second sub-sensor pattern disposed in the second area, and the first sub-sensor pattern and the second sub-sensor pattern have different sizes each other.

23. The display device of claim 22, wherein the sensor patterns include dummy electrodes provided between the first and second sensor patterns, and wherein dummy electrodes disposed to overlap a boundary between the first area and the second area among the dummy electrodes are connected each other to maintain a continuity.

24. The display device of claim 23, wherein first and second bridge patterns disposed in the first area among the sensing area are not disposed on a line connecting the first and second bridged patterns disposed in the second area in a same column.

25. The display device of claim 18, wherein the display panel includes a substrate including a display area displaying the image and a non-display area provided at least one side of the display area;

a pixel circuit layer disposed on the substrate and including at least one transistor;

a display element layer disposed on the pixel circuit layer and including at least one light emitting element that emits light; and an encapsulation layer disposed on the display element layer.

* * * * *